US009152745B2

(12) United States Patent
Glinsky

(10) Patent No.: US 9,152,745 B2
(45) Date of Patent: Oct. 6, 2015

(54) MODEL PREDICTING FRACTURING OF SHALE

(71) Applicant: Michael Edwin Glinsky, Houston, TX (US)

(72) Inventor: Michael Edwin Glinsky, Houston, TX (US)

(73) Assignee: ION Geophysical Corporation, Houston, TX (US)

( * ) Notice: Subject to any disclaimer, the term of this patent is extended or adjusted under 35 U.S.C. 154(b) by 0 days.

(21) Appl. No.: 13/787,573

(22) Filed: Mar. 6, 2013

(65) Prior Publication Data

US 2013/0238304 A1     Sep. 12, 2013

Related U.S. Application Data

(60) Provisional application No. 61/607,564, filed on Mar. 6, 2012.

(51) Int. Cl.
| | | |
|---|---|---|
| *G06F 17/50* | (2006.01) | |
| *G01V 11/00* | (2006.01) | |
| *G01V 99/00* | (2009.01) | |

(52) U.S. Cl.
CPC ............ *G06F 17/5009* (2013.01); *G01V 11/00* (2013.01); *G01V 99/005* (2013.01)

(58) Field of Classification Search
CPC ....... G06F 17/50; G06F 17/5009; G01Y 1/30; G01V 11/00; G01V 99/005
USPC ..................... 703/2, 10; 367/73, 75
See application file for complete search history.

(56) References Cited

U.S. PATENT DOCUMENTS

| | | | |
|---|---|---|---|
| 5,737,220 A * | 4/1998 | Miller ............................ | 702/14 |
| 7,254,091 B1 | 8/2007 | Gunning et al. | |
| 7,516,016 B2 | 4/2009 | DeMartini et al. | |
| 7,519,477 B2 | 4/2009 | Glinsky et al. | |
| 8,473,213 B2 * | 6/2013 | Zhu et al. ......................... | 702/7 |
| 2007/0276901 A1 | 11/2007 | Glinsky et al. | |
| 2007/0277115 A1 | 11/2007 | Glinsky et al. | |
| 2007/0288214 A1 | 12/2007 | DeMartini et al. | |
| 2008/0097702 A1 | 4/2008 | Glinsky et al. | |
| 2008/0154562 A1 | 6/2008 | Blanchette et al. | |
| 2009/0164186 A1 | 6/2009 | Haase et al. | |

(Continued)

OTHER PUBLICATIONS

Arthur, J. D., et al., "Evaluating the Environmental Implications of Hydraulic Fracturing in Shale Gas Reservoirs," All Consulting, copyright 2008.

(Continued)

*Primary Examiner* — Thai Phan
(74) *Attorney, Agent, or Firm* — Blank Rome LLP

(57) ABSTRACT

A model for predicting fracturing in shale can minimize surface disruption, protect groundwater, maximize efficiency of hydraulic fracturing, and manage fluids used in unconventional gas development. The model provides a more comprehensive understanding of the geological, geophysical, and geomechanical properties of shales and imbeds these properties in geomechanical computer simulations to predict both the reservoir performance from the fracturing, and the associated microseismic events generated by fracturing. Since the geological and geophysical properties can be estimated from surface seismic, well logs, and geologic concepts with regional context; the performance of the fracturing can be predicted and optimized. Since the microseismic events can be predicted with the model, the simulations can be verified and the model can be updated to be consistent with the observed microseismic.

22 Claims, 10 Drawing Sheets

(56) References Cited

U.S. PATENT DOCUMENTS

| | | | |
|---|---|---|---|
| 2009/0225628 A1* | 9/2009 | Sayers | 367/73 |
| 2010/0017131 A1 | 1/2010 | Glinsky et al. | |
| 2010/0017132 A1 | 1/2010 | Glinsky et al. | |
| 2010/0076738 A1 | 3/2010 | Dean et al. | |
| 2010/0312534 A1* | 12/2010 | Xu et al. | 703/2 |
| 2010/0326669 A1* | 12/2010 | Zhu et al. | 166/369 |
| 2011/0246154 A1 | 10/2011 | Koutsabeloulis et al. | |

OTHER PUBLICATIONS

Smrecak, T. A., "Jointing and Fracturing in the Marcellus Shale," Marcellus Shale, Issue No. 5, Aug. 2011.
Gale, J. F., "Natural Fractures in Shales: Origins, Characteristics and Relevance for Hydraulic Fracture Treatments," Search and Discovery Article #40338, Oct. 30, 2008.
Refunjol, X. E., et al., "Predicting Hydraulically Induced Fractures Using Acoustic Impedance Inversion Volumes: A Barnett Shale Formation Example," Search and Discovery Article #40829, Nov. 7, 2011.
Glinsky, M., "Metropolis methods applied to Bayesian geologic inversions," CSIRO Presentation, dated Jun. 22, 2011.
Simon Emsley et al., "Integrated workflow 1-21 for the development of calibrated coupled geomechanical flow simulator for unconventional reservoirs", SEG San Antonio 2011 Annual Meeting, 2011, pp. 1871-1875.
Lev Vernik et al., "Rock physics of organic shales 11", The Leading Edge, 2011, pp. 318-323.
International Search Report and Written Opinion regarding PCT Application No. PCT/US2013/029445, dated Nov. 13, 2013.
First Examination Report in counterpart Australian Appl. 2013230933, dated Nov. 24, 2014.
Abstract of J. P. Morris and S. M. Johnson, Direct numerical simulation of fluid driven fracturing events with application to carbon sequestration. 2008.
J. P. Morris and S. M. Johnson, Simulations of fracture and fragmentation of geologic materials using combined FEM/DEM/SPH analysis. MEI Conferences, 2007.
J. P. Morris, M. B. Rubin, S. C. Blair, L. A. Glenn, and F. E. Heuze, "Simulations of underground structures subjected to dynamic loading using the distinct element method," Engineering Computations, vol. 21, No. 2/3/4, pp. 384-408, 2004.
J. P. Morris, L. A. Glenn, and S. C. Blair, "The distinct element method—application to structures in jointed rock," vol. 26, Heidelberg: Springer-Verlag, 2002, pp. 291-306.
Abstract of A. Bobet et al., "Numerical models in discontinuous media: recent advances in rock mechanics," tbd, 2008.
J. Liu and K. Regenauer-Lieb, "Application of percolation theory to microtomography of structured media: Percolation threshold, critical exponents, and upscaling," Physical Review E, vol. 83, No. 1, p. 016106, 2011.
J. Liu, K. Regenauer-Lieb, C. Hines, K. Liu, O. Gaede, and A. Squelch, "Improved estimates of percolation and anisotropic permeability from 3D X-ray micro-tomography using stochastic analyses and visualization," Geochemistry Geophysics Systems, vol. 3, No. 10, p. Q05010, 2009.
A. Karrech, K. Regenauer-Lieb, and T. Poulet, "Frame indifferent elastoplasticity of frictional materials at finite strain," International Journal of Solids and Structures, vol. 48, No. 3-4, p. 407, 2011.
A. Karrech, K. Regenauer-Lieb, and T. Poulet, "Continuum damage mechanics for the lithosphere," Journal of Geophysical Research, vol. 116, No. 4, p. B04205, 2011.
Abstract of A. Karrech, K. Regenauer-Lieb, and T. Poulet, "A Damaged visco-plasticity model for pressure and temperature sensitive geomaterials," Journal of Engineering Science, vol. 49, pp. 1141-1150, 2011.
Abstract of C. A. Barton and M. D. Zoback, "Self-similar distributions of macroscopic fractures at depth in crystalline rock at Cajon Pass scientific drill hole," in Rock Joints, C. A. Barton and O. Stephansson, Eds. Balkema Publishers, 1990.

I. Bogdanov, V. Mourzenko, J.-F. Thovert, and P. Adler, "Effective permeability of fractured porous media with power-law distribution of fracture sizes," Physical Review E, vol. 76, No. 3, pp. 1-15, Sep. 2007.
E. Bonnet et al., "Scaling of fracture systems in geological media," Reviews of Geophysics, vol. 39, No. 3, p. 347, 2001.
O. Bour and P. Davy, "Clustering and Size Distributions of Fault Patterns: Theory and Measurements," Geophysical Research Letters, vol. 26, No. 13, pp. 2001-2004, 1999.
P. Davy, O. Bour, J.-R. De Dreuzy, and C. Darcel, "Flow in multiscale fractal fracture networks," Geological Society, London, Special Publications, vol. 261, No. 1, pp. 31-45, Jan. 2006.
Abstract of V. Mourzenko, J.-F. Thovert, and P. Adler, "Percolation of three-dimensional fracture networks with power-law size distribution," Physical Review E, vol. 72, no. 3, pp. 1-14, Sep. 2005.
Abstract of V. Mourzenko, J.-F. Thovert, and P. Adler, "Macroscopic permeability of three-dimensional fracture networks with power-law size distribution," Physical Review E, vol. 69, No. 6, pp. 1-13, Jun. 2004.
C. E. Renshaw, "Connectivity of joint networks with power law length distributions," Water Resources Research, vol. 35, No. 9, pp. 2661-2670, 1999.
N. Barton, S. Bandis, and K. Bakhtar, "Strength, deformation and conductivity coupling of rock joints," International Journal of Rock Mechanics and Mining Sciences & Geomechanics Abstracts, vol. 22, No. 3, pp. 121-140, Jun. 1985.
Abstract of N. G. W. Cook, "Natural joints in rock: Mechanical, hydraulic and seismic behaviour and properties under normal stress," International Journal of Rock Mechanics and Mining Sciences & Geomechanics Abstracts, vol. 29, No. 3, pp. 198-223, May 1992.
S. Kassis and C. H. Sondergeld, "Fracture Permeability of Gas Shale•:Effects of Roughness, Fracture Offset, Proppant, and Effective Stress," Society of Petroleum Engineers Journal, No. 131376, pp. 1-17, 2010.
Abstract of T. Koyama, N. Fardin, L. Jing, and O. Stephansson, "Numerical simulation of shear-induced flow anisotropy and scale-dependent aperture and transmissivity evolution of rock fracture replicas," International Journal of Rock Mechanics and Mining Sciences, vol. 43, No. 1, pp. 89-106, Jan. 2006.
Abstract of T. Koyama, N. Fardin, and L. Jing, "Shear Induced Anisotropy and Heterogeneity of Fluid Flow in a Single Rock Fracture by Translational and Rotary Shear Displacements—A Numerical Study T. Koyama N. Fardin L. Jing Engineering Geology and Geophysics, Department of Land and Water Resourc," International Journal of Rock Mechanics and Mining Science & Geomechanics Abstracts, vol. 41, No. 3, pp. 1-6, 2004.
E. Lemarchand, C. a. Davy, L. Dormieux, W. Chen, and F. Skoczylas, "Micromechanics Contribution to Coupled Transport and Mechanical Properties of Fractured Geomaterials," Transport in Porous Media, vol. 79, No. 3, pp. 335-358, Jan. 2009.
A. Makuratt, M. Ahola, K. Khair, J. Noorishad, L. Rosengren, and J. Rutqvist, "The Decovalex Test-Case One," International Journal of Rock Mechanics and Mining Sciences & Geomechanics Abstracts, vol. 32, No. 5, pp. 399-408, 1995.
Abstract of K. Matsuki, Y. Kimura, K. Sakaguchi, A. Kizaki, and a. a. Giwelli, "Effect of shear displacement on the hydraulic conductivity of a fracture," International Journal of Rock Mechanics and Mining Sciences, vol. 47, No. 3, pp. 436-449, Apr. 2010.
Abstract of K. Nemoto, H. Moriya, H. Niitsuma, and N. Tsuchiya, "Mechanical and hydraulic coupling of injection-induced slip along pre-existing fractures," Geothermics, vol. 37, No. 2, pp. 157-172, 2008.
Abstract of R. Olsson and N. Barton, "An improved model for hydromechanical coupling during shearing of rock joints," International Journal of Rock Mechanics and Mining Sciences, vol. 38, no. 3, pp. 317-329, Apr. 2001.
D. B. Harris and T. Kvaerna, "Superresolution with seismic arrays using empirical matched field processing," Geophysical Journal International, vol. 182, No. 3, pp. 1455-1477, Sep. 2010.
J. Wang, D. Templeton, and D. Harris, "Discovering new events beyond the catalog—application of matched field processing to Salton Sea geothermal field seismicity," Bulletin of the Seismological Society of America, vol. in prepara, 2011.

(56) References Cited

OTHER PUBLICATIONS

Abstract of I. Das and M. D. Zoback, "Observations of Low Frequency, Long Duration Events in a Microseismic Dataset Recorded in a Horizontal Shale Gas Well," in AAPG, 2011.
P. Isaksson, "Mode II crack paths under compression in brittle solids—a theory and experimental comparison," International Journal of Solids and Structures, vol. 39, No. 8, pp. 2281-2297, Apr. 2002.
Abstract of J. J. Gilvarry and B. H. Bergstrom, "Fracture of brittle solids. III. experimental results on the distribution of fragment size in single fracture," Journal of Applied Physics, vol. 33, No. 11, 1962.
V. Hakim and A. Karma, "Crack Path Prediction in Anisotropic Brittle Materials," Physical Review Letters, vol. 95, No. 23, pp. 1-4, Dec. 2005.
V. Hakim and A. Karma, "Laws of crack motion and phase-field models," 2008.
G. Block, M. Rubin, J. Morris, and J. Berryman, "Simulations of dynamic crack propagation in brittle materials using nodal cohesive forces and continuum damage mechanics in the distinct element code LDEC," International Journal of Fracture, vol. 144, No. 3, pp. 131-147, 2007.
Abstract of C. Renshaw and D. Pollard, "An experimentally verified criterion for propagation across unbounded frictional interfaces in brittle, linear elastic materials," International Journal of Rock Mechanics and Mining Science & Geomechanics Abstracts, vol. 32, No. 3, pp. 237-249, Apr. 1995.
Abstract of R. G. Jeffrey and A. P. Bunger, "A detailed comparison of experimental and numerical data on hydraulic fracture height growth through stress contrasts," SPE Journal, vol. 106030, pp. 413-422, 2009.
Abstract of M. B. Rubin, "Experimental study of hydraulic fracturing in an impermeable material," Transactions of ASME: Journal of Energy Resources Technology, vol. 105, pp. 116-124, 1983.
T. Lhomme, E. Detournay, and R. G. Jeffrey, "Effect of fluid compressibility and borehole radius on the propagation of a fluid-driven fracture," in 11th International Conference on Fracture, 2005.
R. Jeffrey and A. Bunger, "Petroleum engineering: Hydraulic fracturing," CSIRO, 2010.
J. Geerstma and F. de Klerck, "A rapid method of predicting width and extent of hydraulically induced fractures," Journal of Petroleum Technology, vol. 1571, 1969.
Abstract of T. K. Perkins and L. R. Kern, "Widths of hydraulic fractures," Journal of Petroleum Technology, pp. 937-949, 1961.
Abstract of R. P. Nordgren, "Propagation of a vertical hydraulic fracture," Society of Petroleum Engineers Journal, vol. 253, pp. 306-314, 1972.
Abstract of M. D. Zoback, F. Rummel, R. Jung, and C. B. Raleigh, "Laboratory hydraulic fracturing experiments in intact and pre-fractured rock," International Journal of Rock Mechanics and Mining Science & Geomechanics Abstracts, vol. 14, No. 2, pp. 49-58, 1977.
Abstract of R. Suarez-Rivera, S. Green, S. Stanchits, and Y. Yang, "The role of rock on hydraulic fracturing of tight shales," in Proceedings of the Fall Meeting of the American Geophysical Society, 2011.
J. Adachi, E. Siebrits, A. Peirce, and J. Desroches, "Computer simulation of hydraulic fractures," International Journal of Rock Mechanics and Mining Sciences, vol. 44, pp. 739-757, 2007.
Abstract of L. Jing and J. A. Hudson, "Numerical methods in rock mechanics," International Journal of Rock Mechanics and Mining Sciences, vol. 39, No. 4, pp. 409-427, 2002.
A. Dahi-Taleghani and J. E. Olson, "Numerical Modeling of Multi-Stranded Hydraulic Fracture Propagation•: Accounting for the Interaction Between Induced and Natural Fractures," in SPE Annual Technical Conference and Exhibition, 2009, No. 2004, p. SPE 124884.
A. Dahi-taleghani, "Analysis of hydraulic fracture propagation in fractured reservoirs•:an improved model for the interaction between induced and natural fractures," University of Texas—Austin, Austin, TX, 2009.
P. Fu, S. M. Johnson, Y. Hao, and C. Carrigan, "Fully coupled geomechanics and discrete flow network modeling of hydraulic fracturing for geothermal applications," in Proceeding of the 36th Annual Stanford Geothermal Workshop, 2011.

E. G. Flekkoy and A. Malthe-Sorenssen, "Modeling hydrofracture," Journal of Geophysical Research, vol. 107, No. B8, 2151, pp. 1-11, 2002.
Abstract of S. Galindo Torres and J. Munoz Castario, "Simulation of the hydraulic fracture process in two dimensions using a discrete element method," Physical Review E, vol. 75, No. 6, pp. 1-9, Jun. 2007.
Abstract of F. Camborde, C. Mariotti, and F. V. Donze, "Numerical study of rock and concrete behaviour by discrete element modelling," Computers and Geotechnics, vol. 27, No. 4, pp. 225-247, 2000.
Abstract of B. K. Cook, D. Boutt, O. E. Strack, J. R. Williams, and S. M. Johnson, DEM-fluid model development for near-wellbore mechanics. 2004.
Abstract of L. Wei and J. A. Hudson, "A hybrid discrete-continuum approach to model hydro-mechanical behaviour of jointed rocks," Engineering Geology, vol. 49, No. 3-4, pp. 317-325, 1998.
T. H. Antoun, I. N. Lomov, and L. A. Glenn, "Development and application of a strength and damage model for rock under dynamic loading," 2001, pp. 369-374.
Abstract of M. Rubin and I. N. Lomov, "A thermodynamically consistent large deformation elastic-viscoplastic model with directional tensile failure," International Journal of Solids and Structures, vol. 40, pp. 4299-4318, 2003.
Abstract of T. H. Antoun and I. N. Lomov, Simulation of a spherical wave experiment in marble using a multidirectional damage model. 2003.
J. D. Clayton, "A model for deformation and fragmentation in crushable brittle solids," International Journal of Impact Engineering, vol. 35, No. 5, pp. 269-289, 2008.
Abstract of J. F. Hazzard and R. P. Young, "Dynamic modelling of induced seismicity," International Journal of Rock Mechanics and Mining Sciences, vol. 41, No. 8, pp. 1365-1376, Dec. 2004.
Abstract of S. Abe, S. Latham, and P. Mora, "Dynamic Rupture in a 3-D Particle-based Simulation of a Rough Planar Fault," Pure and Applied Geophysics, vol. 163, No. 9, pp. 1881-1892, Sep. 2006.
J. H. H Dieterich and B. D. Kilgore, "Direct observation of frictional contacts: New insights for state-dependent properties," Pure and Applied Geophysics Pageoph, vol. 143, No. 1-3, pp. 283-302, 1994.
J. R. R Rice, "Constitutive relations for fault slip and earthquake instabilities," Pageoph, vol. 121, No. 3, pp. 443-475, 1983.
G. Zhang and J. R. Rice, "Conditions under which Velocity-Weakening Friction Allows a Self-healing versus a Cracklike Mode of Rupture," Bulletin of the Seismological Society of America, vol. 88, No. 6, pp. 1466-1483, 1998.
K. Uenishi, "Universal nucleation length for slip-weakening rupture instability under nonuniform fault loading," Journal of Geophysical Research, vol. 108, No. 1, 2003.
Abstract of M. Ohnaka and Y. Kuwahara, "Characteristic features of local breakdown near a crack-tip in the transition zone from nucleation to unstable rupture dueing stick-slip shear failure," Tectonophysics, vol. 175, pp. 197-220, 1990.
Abstract of M. Ohnaka, "A Physical Scaling Relation Between the Size of an Earthquake and its Nucleation Zone Size," Pure and Applied Geophysics, vol. 157, pp. 2259-2282, 2000.
P. M. Mai, "A spatial random field model to characterize complexity in earthquake slip," Journal of Geophysical Research, vol. 107, No. 11, 2002.
Abstract of M. Karimi-Fard, L. J. Durlofsky, and K. Aziz, An efficient discrete fracture model applicable for general purpose reservoir simulators. Society of Petroleum Engineers, 2003.
S. C. Myers, G. Johanneson, and W. Hanley, "A Bayesian hierarchical method for multiple-event seismic location," Geophysical Journal International, vol. 171, pp. 1049-1063, 2007.
S. C. Myers, G. Johanneson, and W. Hanley, "Incorporation of probabilistic seismic phase labels into a Bayesian multiple-event seismic locator," Geophysical Journal International, vol. 177, pp. 193-204, 2009.
N. A. Simmons, S. C. Myers, and G. Johanneson, "Global-scale P wave tomography optimized for prediction of teleseismic and regional travel times for Middle East events: 2. Tomographic inversion," Journal of Geophysical Research, vol. 116, 2011.

(56) References Cited

OTHER PUBLICATIONS

S. C. Myers, G. Johanneson, and R. J. Mellors, "Bayesloc: A robust location program for multiple seismic events given an imperfect earth model and error-corrupted data," in Geothermal Resource Council Annual Meeting, 2011.

S. Mallat, "Group invariant scattering," ArXiv, vol. 1101.2286, 2011.

O. Y. Vorobiev, B. T. Liu, I. N. Lomov, and T. H. Antoun, "Simulation of penetration into porous geologic media," Jul. 2005.

T. H. Antoun, O. Y. Vorobiev, I. N. Lomov, and L. A. Glenn, Numerical simulations of an underground explosion in granite. 1999.

T. H. Antoun, L. A. Glenn, O. R. Walton, P. Goldstein, I. N. Lomov, and B. Liu, "Simulation of hypervelocity penetration in limestone," 2005.

Abstract of T. H. Antoun, I. N. Lomov, and L. A. Glenn, "Simulation of the penetration of a sequence of bombs into granitic rock," International Journal of Impact Engineering, vol. 29, No. 1-10, pp. 81-94, 2003.

* cited by examiner

MODEL PREDICTING FRACTURING OF SHALE

CROSS-REFERENCE TO RELATED APPLICATIONS

This application claims the benefit of U.S. Provisional Appl. 61/607,564, filed 6 Mar. 2012, which is incorporated herein by reference in its entirety.

BACKGROUND OF THE DISCLOSURE

Currently, there is little understanding of how shales fracture. At best, empirical models based on very simplified physics are used, but there is no way to relate geophysically observable properties of the shale to its geomechanical properties. Moreover, even given a geological model, there are also no computer models that can reliably predict the microseismic response of the shale fractures. Finally, existing methods of analyzing microseismic data utilize only a very small amount of the information in estimating the origin of the microseismic events.

A number of difficulties have led to such poor understanding of how shales fracture. Primarily, understanding shale fracturing requires compiling together a great deal of information. For example, the porosity and mineralogy of the shale may need to be known at multiple scales to understand shale fractures and the geomechanical response. Additionally, the coupled contributions of fractures, variable pore types, microporosity, and mineral heterogeneity to geophysical response in shale may need to be understood. Other difficulties lie in properly estimating the errors involved in predicting factures in shale and in the possibility that the data can have pronounced anisotropy, which would affect the accuracy in locating fractures in the shale. Some computational tasks (such as source scanning, modeling of synthetic waveforms, etc.), may be cumbersome and may require significant resources and time to complete.

Due to these difficulties, current stimulation techniques of areas having shale are based on little knowledge of how the shale is fracturing. Additionally, current production profiles merely indicate that active fractures in shale are at least 100 meters apart. In the end, such currently used techniques in the industry have low efficiency and use a protocol developed with only rudimentary knowledge of what is going on. In the end, operators are unable to explain or predict their results.

Because of the poor knowledge available in the industry about fractures in shale, more understanding about the fracturing of shale in an area of interest can increase both the reserves and production associated with the area. In fact, increases in both reserves and production may be possible by an order of magnitude if more accurate understanding about the fracturing of shale can be determined.

The subject matter of the present disclosure is directed to overcoming, or at least reducing the effects of, one or more of the problems set forth above.

SUMMARY

A method, system, and program storage device are disclosed for predicting fractures in shale in an area of interest. One or more relationships between a geological parameter of shale are established with one or more of a geomechanical parameter and a geophysical parameter of the shale. For example, information characterizing geological parameters is obtained of the shale, and geomechanical and geophysical parameters are obtained of the same shale. The geological, geomechanical, and geophysical parameters can be characterized at multiple scales, and the information characteristic of these parameters can be obtained by analyzing properties of the shale from one or more of core samples, well logs, and scans of the core samples. Empirical relationships are then developed between the obtained information on the parameters. For example, geomechanics of rock fracturing in the shale can be modeled by relating the geological parameters of the shale with the geophysical and geomechanical parameters of the shale.

Observed data of the area of interest is obtained, and a computerized model for modeling or predicting fracturing of shale in the area of interest is produced by constraining a forward physics model of the area of interest with the one or more relationships for consistency with the observed data. In one example, seismic data is obtained in the area of interest using a seismic survey system, and a computerized model for predicting fracturing of the shale in the area of interest is produced by inversion of the seismic data with the previously developed trends. Microseismic data can also then obtained in the area of interest using a microseismic survey system, and the predictive model can be refined by inversion of the microseismic data with the previously determined model.

The disclosed model combines the geological, the geophysical, and most importantly, the geomechanical properties of shales, and embeds this information in geomechanical computer simulations that predict the reservoir performance from fracturing of the shale and that also predict the associated microseismic generation. Since the geological and geophysical properties can be estimated from surface seismic data, well logs, and geologic concepts with regional context; the performance of the fracturing can be predicted and optimized. Additionally, since the microseismic data can be predicted; any simulations of microseismic events can be verified by obtaining microseismic data, and the disclosed model can be updated to be consistent with the observed microseismic data.

The approach disclosed herein can make significant improvements in recovery from shale. In addition to the benefit of increased production, the approach disclosed herein can help predict how fracturing in shale can reduce the amount of water needed to fracture a formation. Stimulations can also be designed based on the knowledge of fracturing in shales to minimize the probability of contaminating ground water resources. In fact, just being able to estimate the probability or risk of fracturing a formation would be a major advancement in the industry. Finally, the disclosed approach makes it possible to determine what data should be acquired and how to use that data to predict shale fracturing.

DETAILED DESCRIPTION OF THE DISCLOSURE

A. Summary

Figure 1A:
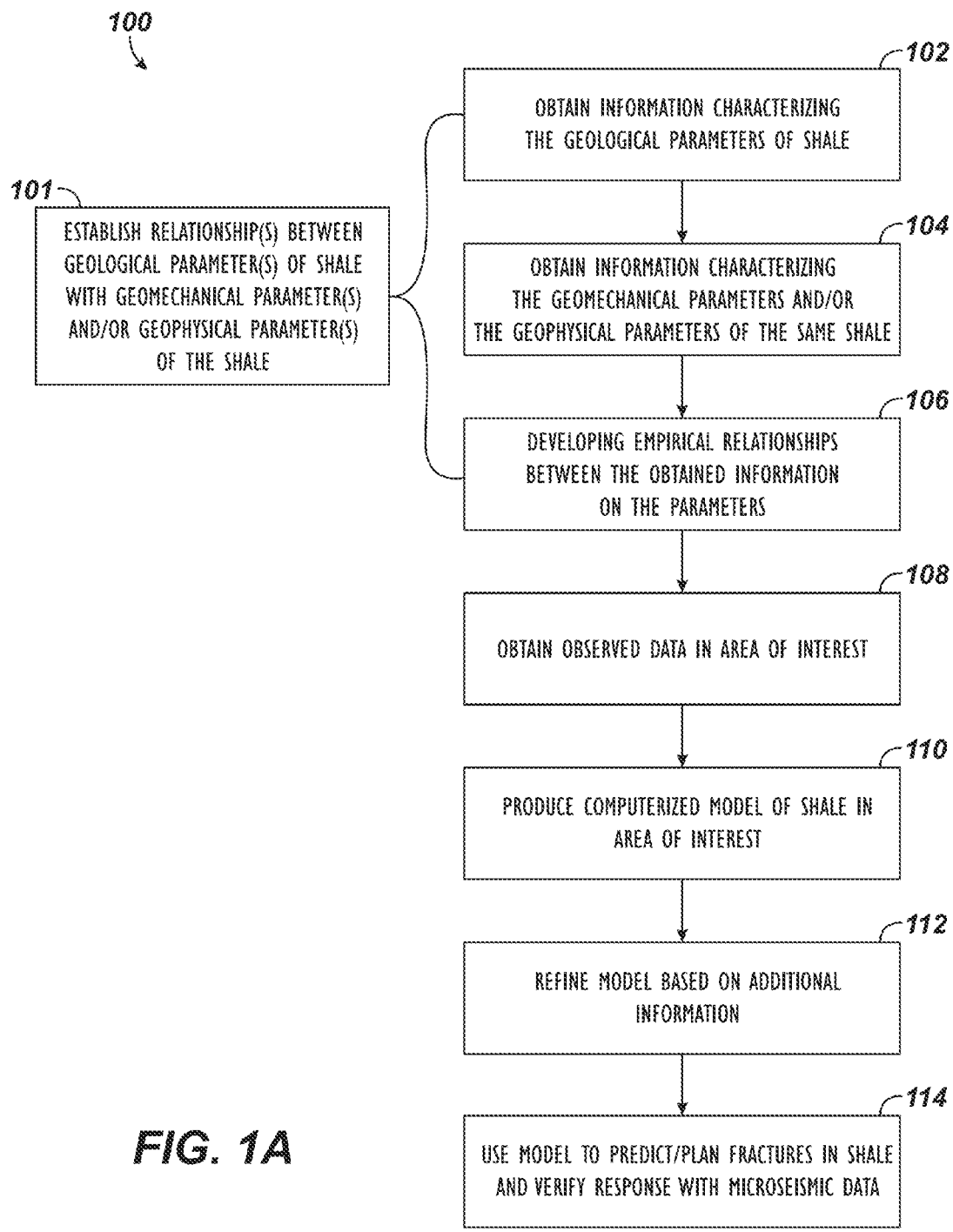
FIG. 1A shows a process for developing a model to predict fracturing in shale according to the present disclosure.
Figure 1B:
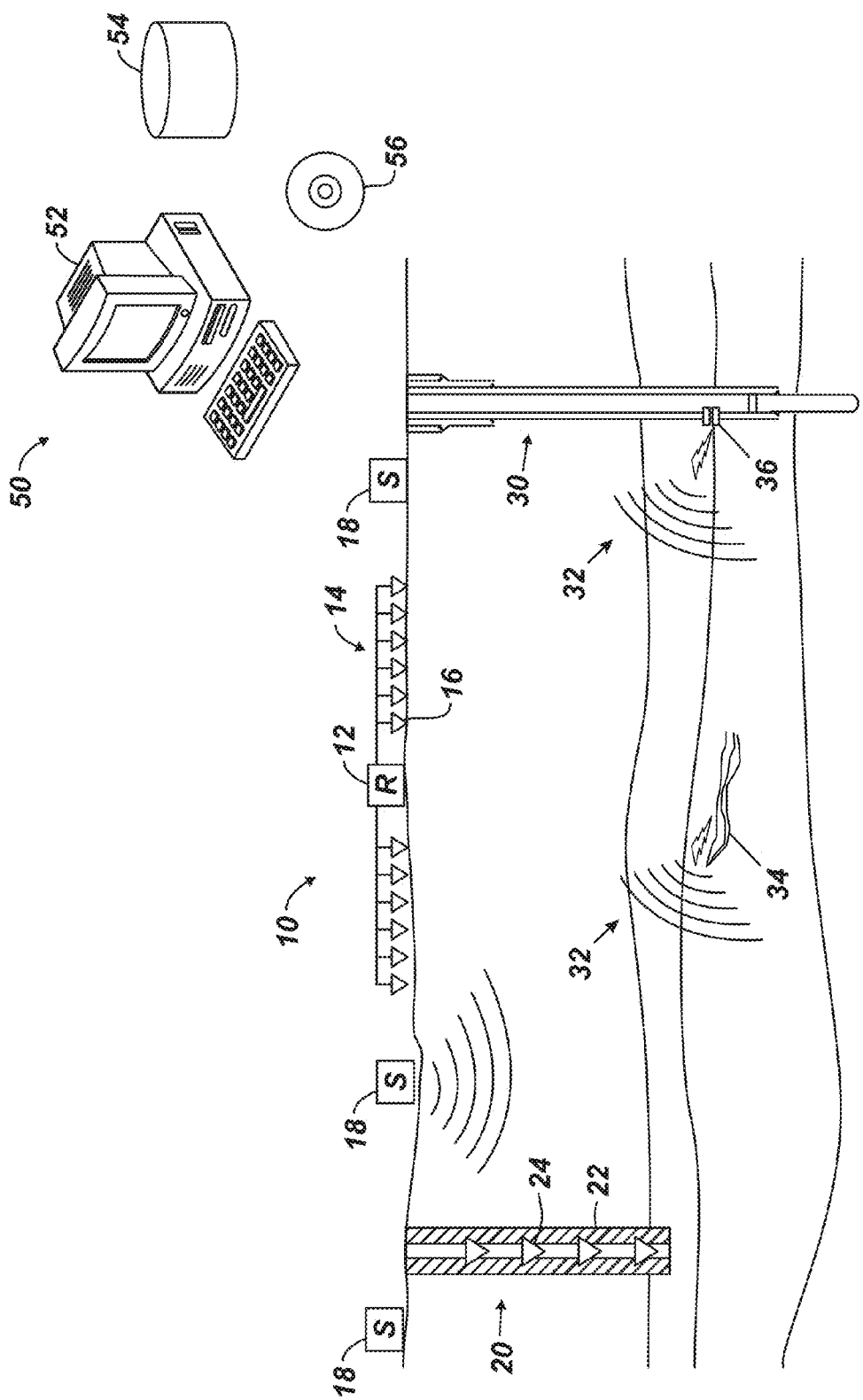
FIG. 1B diagrams components for developing and using the disclosed model for predicting fracturing in shale.

Disclosed herein is a model for predicting fracturing of shale, which can be used for a number of purposes disclosed herein. A process 100 shown in FIG. 1A is used to develop the predictive model. FIG. 1B diagrams some components for developing and using the disclosed model to predict facture in shale. These FIGS. 1A-1B will be discussed together in describing the development of the predictive model.

Initially, one or more relationships are established between geological parameter(s) of shale with geomechanical parameter(s) and/or geophysical parameter(s) of the shale (Block 101: FIG. 1A). To do this, for example, information characterizing geological parameters of shales is obtained at multiple scales (e.g., micron, nano-scale, millimeter, plug, or seismic scales) (Block 102: FIG. 1A). As then shown in FIG. 1A, information characterizing the geomechanical parameters and/or the geophysical parameters of the same shale is also obtained (block 104).

The characteristic information can be obtained generally at locations having shale and/or at a particular area of interest related to a formation being analyzed for production and exploration. As will be discussed below, the characteristic information of the shale can be estimated from surface seismic surveys, core samples, well logs, geologic information, scanned images of core samples, and other details. Briefly, as shown in FIG. 1B, a surface seismic system 10 having recording units 12, arrays 14 of surface geophones 16, and seismic sources 18 can obtain surface seismic data for this empirical information. Existing or newly drilled wells 30 may be logged using techniques known in the art, and core samples can be obtained of shales to obtain the requisite information.

As then shown in FIG. 1A, empirical relationships (i.e., trends) are developed between the obtained information on the parameters (Block 106). For instance, as shown in FIG. 1B, processing systems 50 (e.g., computers 52, databases 54, and the like) can be used to generate the empirical relationships (i.e., trends) in the shale are developed from the various forms of information characterizing the parameters of the shale. Thus, the processing systems 50 in FIG. 1B and associated software programs 56 can be used to develop the relationships for use in computer simulations and the like.

Next in the process of FIG. 1A, observed data of the area of interest is obtained (Block 108). For example, seismic data is obtained in the area of interest using various techniques for seismic imaging. For instance, as shown in FIG. 1B, surface seismic systems 50 having recording units 12, arrays 14 of surface geophones 16, and seismic sources 18 can obtain surface seismic data of the area of interest for this purpose. Other types of observed data can be obtained. For instance, the observed data can include, but is not limited to, compressional surface seismic data, converted wave seismic data, microseismic data, well log data, geologic data on depositions in the area of interest, electromagnetic data, production data (e.g., pressure data, produced volumes, or injected fluid volume), or a combination of these.

Once such observed data is obtained, the process 100 of FIG. 1A produces a computerized model for modeling or predicting fracturing of shale in the area of interest by constraining a forward physics model of the area of interest with the one or more relationships for consistency with the observed data (Block 110). The forward physics model can include, but is not limited to, a full seismic wave propagation model; a geomechanical forward model; a spike convolution model; a raytrace seismic model; a hyperbolic moveout model for flat earth layers; an electromagnetic propagation model; a mode for basin evolution including pressure diffusion, sedimentation, or compaction; and a model of a geologic process of sedimentation including wave induced flow, turbidite flow, or fluvial deposition.

Constraining the forward physics model based on the one or more relationships for consistency with the observed data can use one of several data assimilation methods of the observed data with the one or more relationships. In general, the data assimilation method can include, but is not limited to, inversion, Bayesian inversion, linear inversion, an inversion finding a minimum of an objective function, an inversion of an estimated response surface to the forward physics model, a heuristic optimization, or a combination of these. In this regard, a stochastic engine can be used to develop a response surface.

For example, in Block 110 of FIG. 1A, the predictive model of the fracturing in the shale can be produced by an inversion process of the seismic data with the previously developed trends. This inversion process can be enhanced by obtaining microseismic data of the area of interest. For example, as shown in FIG. 1B, a system 20 of buried arrays 22 of geophones 24 may be used to obtain microseismic data 32 resulting from natural fault occurrences 34, from hydraulic fracturing operations 36 in a well 30, from production operations in the well 30, or the like. For instance, a microseismic event may occur due to an earthquake, a fault slippage, a production operation in the well 30, a fracturing operation in the well 30, or the like.

Finally, as shown in the process of FIG. 1A, the model for predicting fracturing in the shale can be refined using additional information from other inversion stages and from interpretation of additional seismic data (Block 112). As understood herein, the disclosed model is a computerized model running as computer algorithms on the processing system 50. Operators can use the determined model in exploration, treatment, and production of a reservoir in the area of interest.

Although hinted to above, operators make various decisions to determine what data to acquire to create the model so fractures in the shale can be forecast. Typical decisions made for data acquisition include, but are not limited to: selecting location for drilling wells, selecting what well logs to acquire in a well, determining whether to monitor microseismic events associated with the fracturing of the shale from a particular well, deciding whether multicomponent surface seismic should be acquired and where, and determining whether data from one or more microseismic buried arrays should be acquired at the same time as the surface seismic data. These and other considerations will be appreciated with the benefit of the present disclosure.

Figure 1C:
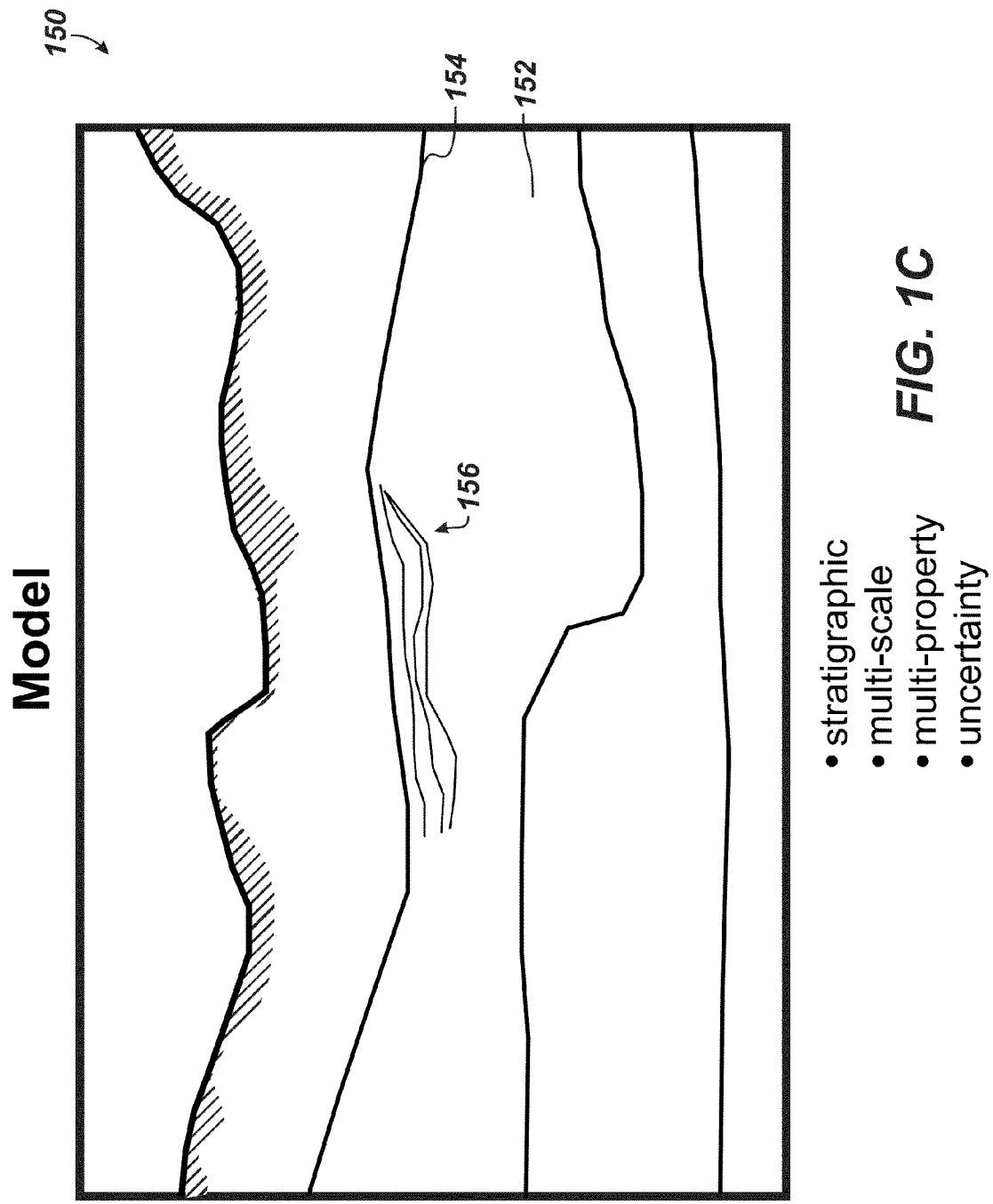
FIG. 1C illustrates a graphical representation of information produced by the disclosed model for predicting fracturing in shale.

As a result of developing and refining the disclosed model for predicting fracturing in the shale, a graphical representation 150 of information as shown in FIG. 1C can be produced by the disclosed model. In general, the disclosed model can provide stratigraphic data on various layers 152 and boundaries 154 in the shale of the area of interest, such as a target reservoir of a formation. The model can also provide detailed information (i.e., structure, parameters, properties, etc.)

about those various layers 152 at multiple levels of scale 156. A level of certainty of the information may also be included in the disclosed model.

Using the disclosed model and the representative information it can provide, operators can predict how the shale in the area of interest will fracture during fracturing and other operations in the well 30 in the target area. Operators can also use the predictions of shale fracturing to plan and execute various operations, including where to drill wells in the area, what additional data to obtain of the formation, how and where to perform fracture treatments of the formation, etc.

Finally, as shown in the process of FIG. 1A, operators can use the disclosed model for predicting fractures in the shale to actually predict and plan various operations and resulting fractures in the area of interest (Block 114). As shown in FIG. 1B, for instance, being able to predict or forecast fractures in shale, operators can plan facture operations 36 in the area of interest. Other operations can also be planned, such as fluid treatments, drilling boreholes 30, production from boreholes 30, etc. In fact, forecasting fractures in shales can impact several types of operations.

Ultimately as shown in Block 114 of FIG. 1A, in response to such operations, operators can obtain microseismic data from fractures or microseismic events occurring in the shale as a result of the determined operations, and operators can use the microseismic results to verify and refine the predictive model based on the microseismic data obtained. Again, as shown in FIG. 1B, the system 20 of buried arrays 22 of geophones 24 may be used to obtain microseismic data 32 resulting from natural fault occurrences 34, from hydraulic fracturing operations 36, or the like, which were predicted, so the results can be used to verify and refine the predictive model.

Being able to characterize the fracture behavior of the shale in the area of interest using the disclosed model offers operators a number of useful benefits. For example, operators can use the predictive model to minimize surface disruption, help protect groundwater, increase the efficiency of hydraulic fracturing, and better manage fluids used in gas development from shale. More specifically, the predictive model can provide operators with more comprehensive information about the geological, geophysical, and geomechanical properties of shales in the formation. This information can then be embedded in geomechanical computer simulations to predict both the reservoir performance from a fracturing operation and the associated microseismic events generated from such a fracturing operation.

Additionally, as noted above in Block 114 of FIG. 1A, the predictive model can also predict the microseismic events expected from a fracturing operation or other such operation in the shale of the area of interest. Using microseismic data obtained in response to such operations, operators can verify the computer simulations of the predictive model developed and can then update the model so it is consistent with the observed microseismic data. For instance, the predictive model can assimilate microseismic data obtained from multi-component geophones, both P and S waves, and surface seismic data in an integrated statistical way to give the largest number of events with minimum uncertainty in both their location and moment magnitude tensors. This microseismic modeling can improve the velocity and attenuation models (with uncertainty) used in locating microseismic events and used in surface seismic imaging.

Finally, the predictive model can improve stimulation methods, increase the producible volume of a reservoir associated with a particular well, and characterize subsurface properties so that subsurface zones with poor productivity will not be drilled. The predictive model can be used in the design of treatment protocols and plans that minimize the probability that groundwater resources will be affected. Finally, the predictive model can be used to control the size and orientation of a stimulated zone, maximize the stimulated zone per volume of fluid injected, and lead to treatments using less fluid. These and other useful benefits may be found.

B. Predictive Model of Fracturing of Shale

With a general understanding of how to develop a predictive model of fracturing in shale and how the model can be used, discussion now turns to more particular details on how to develop the predictive model.

Figure 2A:
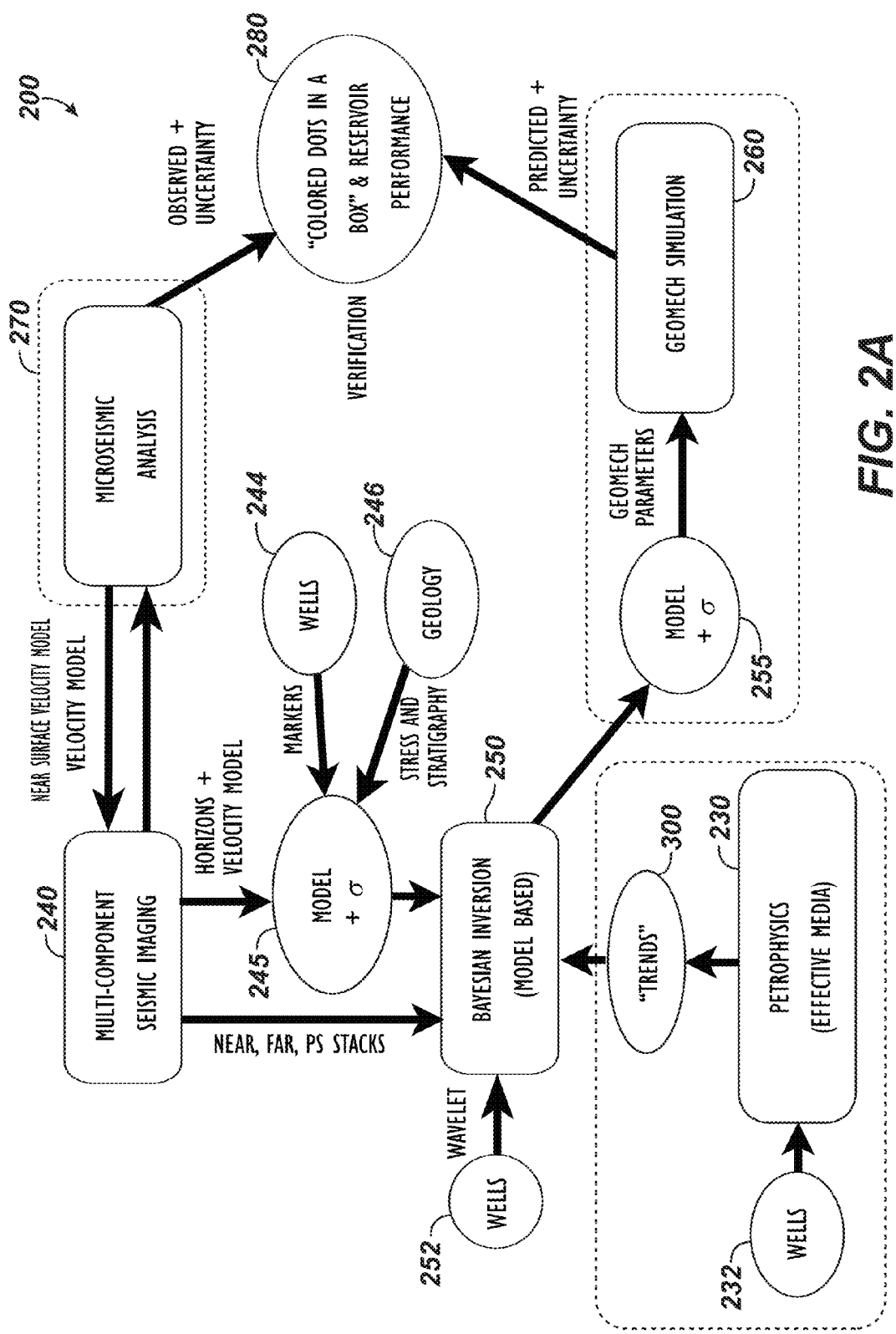
FIG. 2A shows a first workflow for developing the disclosed model to predict fracturing in shale.

FIG. 2A shows a workflow 200 for developing the disclosed model for predicting fracturing in shale. The workflow 200 includes multiple stages interacting with one another to first build and then refine the disclosed model for predicting the fracturing in shale. In general, these stages include a petrophysical modeling stage 230, a multi-component seismic imaging stage 240, a model-based inversion stage 250, geomechanical simulation stage 260, and microseismic analysis stage 270.

The end result in FIG. 2A is a verification stage 280 in which fractures predicted by the disclosed model with a level uncertainty are compared to actual microseismic data measured by the microseismic analysis stage 270. In a general sense, plots of microseismic event hypocenters can be compared to predicted responses. As will be appreciated, the information provided by the microseismic events can reveal details of the interplay of rock properties and fracture treatment. This comparison can be used to verify and correct the predictive model.

Figure 2B:
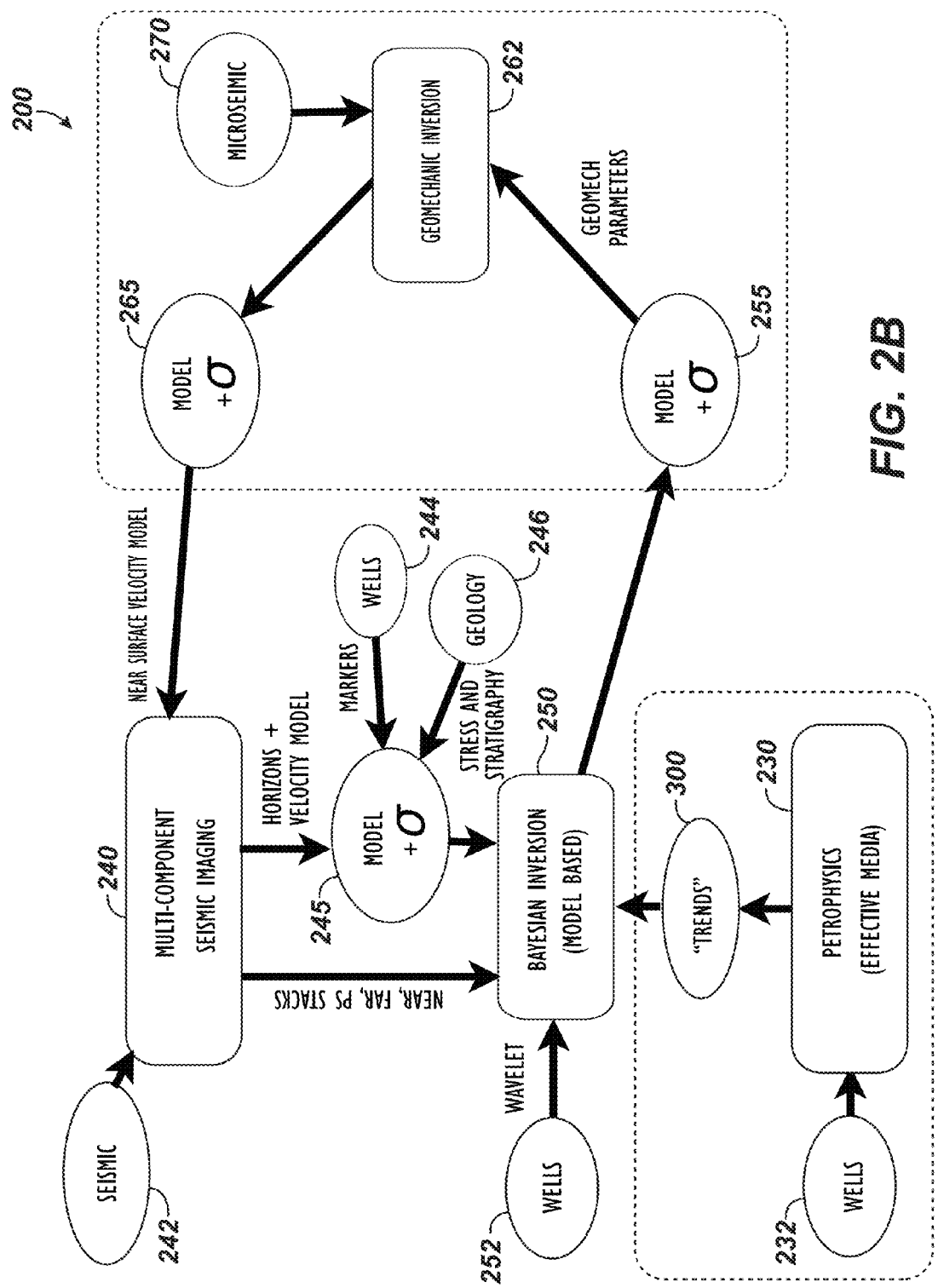
FIG. 2B shows a second workflow for developing the disclosed model to predict fracturing in shale.

FIG. 2B shows another (looped) workflow 200 for developing the disclosed model for predicting the fracturing in shale. Many of the same stages 230, 240, etc. as used in the workflow 200 of FIG. 2A are used in FIG. 2B. However, this second workflow 200 uses a geomechanical inversion stage 262, which includes geomechanical forward modeling of the predictive model to give the microseismic response. In other words, the geomechanical inversion during stage 262 constrains the predictive model to give the microseismic response, which can be verified by actual microseismic analysis 270. To do this, the geomechanical inversion 262 can be a Bayesian inversion that constrains the model to fit the observed microseismic data.

Moreover, this second workflow 200 in FIG. 2B operates in a looped fashion. In particular, based on the microseismic data, the geomechanical inversion 262 constrains the predictive model to give the microseismic response as noted above. Information about the microseismic events can be used to update the velocity model, especially in the near vicinity of the microseismic event location. This updated velocity model can in turn be used to improve surface seismic imaging or improve positioning of other near-by microseismic events. Accordingly, details of a resulting near surface velocity model 265 can be used as input to the multi-component seismic imaging 240 to provide a more detailed model 245 having horizons and velocity model data to which markers of the wells 244 and stress and stratigraphy of the geology 246 can be applied.

The following description will focus primarily on the details of the workflow 200 in FIG. 2B. The stages 230, 240, etc. integrated into the workflow 200 of FIG. 2B produces a model with uncertainty based on an inversion of a multiple component dataset, wells, and geologic concepts. For example, results from the petrophysical analysis stage 230 and multi-component seismic imaging stage 240 provide geomechanical properties to the predictive model with uncertainty. The geological structure and parameters are estimated with uncertainty from the surface seismic data obtained using an understanding the geomechanics of shales. Results from the geomechanic inversion 262 give a prediction of the production and microseismic response, which can include the uncertainty. The predicted response is in turn constrained by comparison to the microseismic response with uncertainty analyzed with the microseismic analysis stage 270.

Once the model is constrained by the surface seismic data, petrophysical information, wells, geology, and microseismic data, operators can use the developed model to simulate various modifications to the fracturing process and to optimize the productivity, water utilization, environmental footprint, and other aspects detailed herein. In the end, given the geological structure and parameters of the shale, the resulting model developed with this workflow 200 can predict the microseismic response and the production response of the shale's fracturing.

C. Capabilities of the Predictive Model

The disclosed model for predicting shale fracturing produces a number of capabilities. In a first capability, results of an experimental study of the multi-scale structure of shales in a field (petrophysical modeling 230) and a resulting effective geomechanical inversion (262: FIG. 2B) embedded in a high fidelity computer, or low fidelity, simulation are obtained. Surface seismic data (240) of the field is also obtained. Given this information, the geological structure and parameters of the field are estimated with uncertainty. Having the geological structure and parameters, the predictive model then enables operators to predict the microseismic and production response of shale fracturing, which can include the uncertainty. These responses can be directly validated by comparison to the analysis of the microseismic data with uncertainty obtained from the microseismic data analysis stage (270). With the validated measurements, different methods and details of the fracturing process can be simulated to optimize the productivity, water utilization, and environmental footprint of the fracturing process.

In another capability, the predictive model uses a Bayesian inversion (250) to update the geological structure and parameters so the structures and parameters are consistent with the seismic observations made in the seismic analysis (240). A fast, low fidelity computer simulation (detailed below) can be used for the updating process (262: FIG. 2B) because many models may need to be geomechanically simulated in such a geomechanical inversion (262: FIG. 2B).

D. Stages of Workflow

As can be seen, the workflow 200 can operate in an iterative fashion building the predictive model from one stage to the next and refining the model to assimilate observed measurements and the resulting model. Each of the stages is discussed in turn below.

In FIG. 2B, the development of the predictive model is based on an experimental study of the multi-scale structure of the shale in the petrophysical analysis stage 230. Using samples from wells 232, for example, the multi-scale structure of the shale is performed using 2D and 3D image data from a number of analysis sources, including 3D micro-CT (Computed Tomography), 2D SEM (Scanning Electron Microscope), 2D SEM-EDS (Scanning Electron Microscope Energy Dispersive Spectroscopy), and 3D FIBSEM (Focused Ion Beam Scanning Electron Microscope), for example. All of the image data from the analysis is co-registered, and a comprehensive suite of shales are imaged as they fracture under a set of applied stresses. The characteristics of the comprehensive suite of shales can be developed from the particular area of interest or more generally from multiple areas and can be stored in a database (54: FIG. 1B) associated with a processing system (50: FIG. 1B).

Techniques based on statistical mechanics are then used to reduce the above-experimental data into numerical models for input into geomechanical computer simulations of the processing system (50: FIG. 1B). Both these new material models, as well as some well verified existing models, are incorporated into geomechanical simulation capabilities. Preferably, the geomechanical simulating capabilities can scale onto large computer clusters and make a minimum amount of assumptions about the physics.

The development of the predictive model is also based on surface seismic surveys 242 and microseismic surveys 270 obtained of the area of interest. In these surveys 242 and 240, microseismic and surface seismic data is obtained using seismic equipment and systems, such as surface seismic systems (10: FIG. 1B) and microseismic systems (20: FIG. 1B), known and used in the art so that they are not detailed here.

Finally, Bayesian statistical and other techniques are used to analyze the microseismic and surface seismic data in an integrated way with uncertainty. This analysis then forms a basis for verifying the model 265 for predicting facturing in shale. As noted above, such a verified predictive model 265 for optimization of shale fracturing with uncertainty is useful for optimizing the creation of fracture networks in a subsurface during facture treatments and can lead to increased productivity, reduced water utilization, and reduced environmental footprint of fracturing operations.

As noted above, currently there is little understanding of how shales fracture, and empirical models are currently based on very simplified physics. There is no way to relate geophysically observable properties to the geomechanical properties. There are also no computer models that can reliably predict the microseismic response given the geological model. Finally, methods of analyzing microseismic data utilize only a very small amount of the information in estimating the origin of the microseismic events.

For these reasons, the development of the disclosed predictive model first obtains experimental geophysical measurements in the petrophysical stage 230 and obtains 3D imaging data 242 and 270 to enhance understanding of shale fractures at multiple scales. This stage 230 is described in more detail below.

1. Petrophysical Analysis a. Identification of Multi-scale 3D Mineralogy and Defects As noted above, developing the disclosed model involves obtaining empirical information characterizing geological parameters of shales at multiple scales during petrophysical analysis. See Block 102 in FIG. 1A and stage 230 in FIGS. 2A-2B.

The empirical information can be obtained by using core analysis techniques from core samples in the area of interest or of comparable shales. Typical core analysis techniques for shale-gas reservoir rocks include the analysis of porosity, fluid saturation, elastic response and permeability; however, several studies have shown that the results obtained from different core analysis laboratories can vary significantly, reflecting differences in analytical technique, differences in definitions of fundamental rock and fluid properties, or the millimeter-scale variability common in mudstones that make it problematic to select multiple samples with identical attributes. See e.g., Sondergeld et al, SPE 131771, 2010; Ambrose et al., SPE131772, 2010; Passey et al., SPE 131350, 2010. A multi-scale approach to the characterization of the porosity, pore and throat size distribution, pore connectivity, permeability, geomechanical response, and petrophysical response is preferably used to better characterize mudstones.

Therefore, the predictive model preferably uses a multi-scale approach to the characterization of the porosity, structure and connectivity, permeability, and petrophysical response, and multiphase flow response to better characterize mudstones. This includes characterizing the heterogeneity and connectivity of the primary constituents (e.g., kerogen, clay, minerals, etc.) at the micron to millimeter to plug scale and imaging and analyzing the porosity, pore throats, and connectivity at the nano-scale of these different constituent phases. Estimations of petrophysical and multiphase properties are made at the nano-scale and effectively upscaled to plug scales. Imaging is undertaken at ambient and at variable overburden conditions to characterize the evolution of core material structure and response under variable stress/strain states.

The methods use 2-D and 3-D image data obtained at multiple scales via micro-CT, 2D SEM, 2D SEM-EDS data, and 3D FIBSEM data to characterize the pore structure and petrophysical properties of mudstones. Scales considered can range from the plug to the nano-pore scale. The analysis can identify mineral, kerogen, and clay distribution/connectivity at the largest scale possible; preferably at plug scale. High resolution FIBSEM data can then probe the porous microstructure of the key phases at the micro/nano-scale. X-Ray tomography can be used and returns stacks of images of intensity maps, which correspond to atomic number. A high intensity (bright) image corresponds to a high atomic number a low intensity (dark) image to a low atomic number. A pre-processing workflow can be used to identify target phases from the tomographic greyscale intensity images of the experiments. The target phase may be pores, grains, or any kind of material phase/microstructure of interest, each with a separable intensity spectrum.

Figure 3:
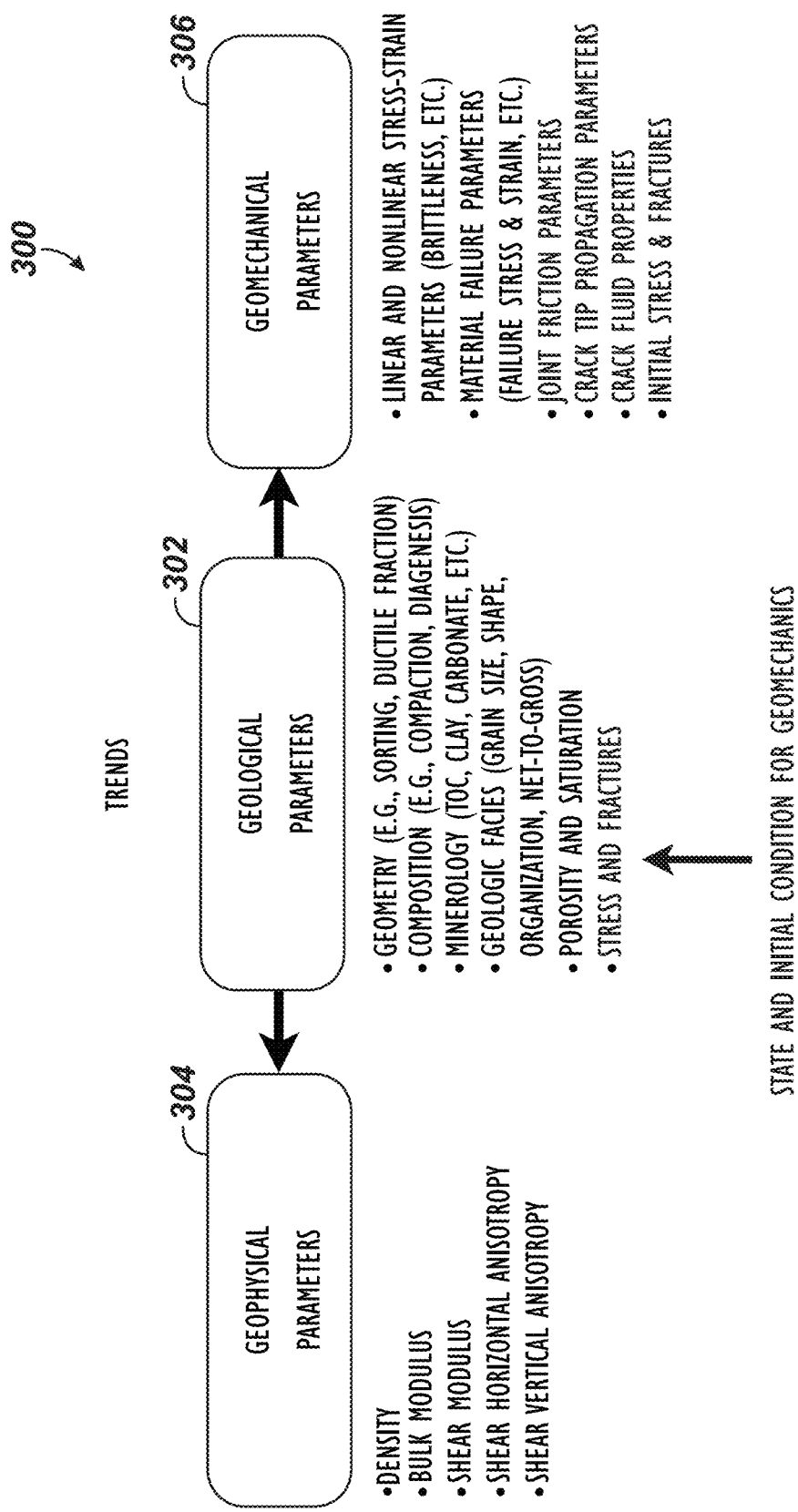
FIG. 3 shows a relationship of geological parameters with geophysical and geomechanical parameters in defining trends for the petrophysical analysis of the disclosed model in FIGS. 2A-2B.
Figure 4:
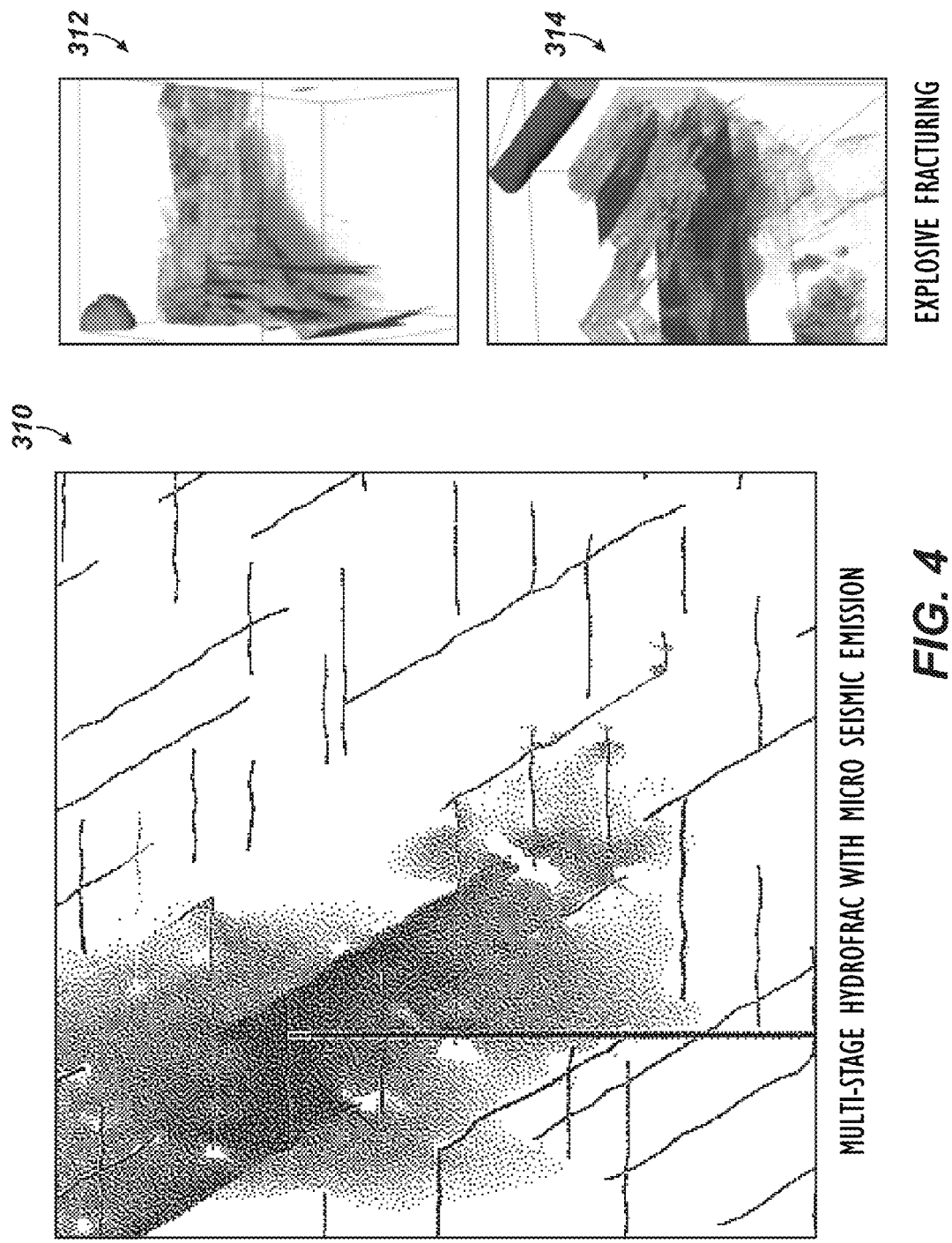
FIG. 4 shows graphical representations of geomechanics of rock fracturing.

All of the above information can then be integrated to better understand pore structure and connectivity, geomechanical response, and the petrophysical properties of the complex rocks. As shown in FIG. 2B, the pretrophysical analysis stage 230 provides information on various empirical relationships or trends 300 associated with the shale. Turning briefly to FIG. 3, details of such trends 300 are shown. The trends 300 relate geological parameters 302 of the shale with the geophysical and geomechanical parameters 304 and 306 of the shale. As shown, the geological parameters 302 include the minerology, geological facies, porosity and saturation, and stress and fractures (which are the state and initial conditions of the geomechanics of the shale). These geomechanical parameters 302 relate to the geophysical parameters 304 of the shale, such as density, bulk modulus, shear modulus, etc. and also relate to the geomechanical parameters 306 of the shale, such as non-linear stress-strain, material failure, etc. For visual reference, FIG. 4 shows graphical representations 310, 312, and 314 of the geomechanics of rock fracturing.

In the pretrophysical analysis stage 230 of FIGS. 2A-2B, a number of tasks are performed to understand the geomechanics of the shales. As hinted above, one task involves the experimental study of multi-scale structure of shales. This can be done by taking core samples that are well characterized in terms of their geological context (stratigraphic facies) and span the full range geologic contexts. For example, up to 230 core samples of shales may be used.

From these samples, 2-D and 3-D image data is obtained at multiple scales via micro-CT, 2D SEM, 2D SEM-EDS data and 3D FIBSEM data for each sample. High resolution FIBSEM data then probes the porous microstructure of the key phases at the micro/nanoscale. Through image registration, the higher resolution data is used to characterize the important constituent phases at the nanoscale and upscale the properties back to the larger core plug scale. Each sample is imaged under different applied stresses to understand where and how it fractures. This information is then integrated to better understand the porosity, pore, and throat size distribution, mineralogy, pore connectivity, permeability and their impact on geomechanical and petrophysical response.

In the pretrophysical analysis stage 230, the experimental measurements are conducted on the shale samples to understand their geophysical, geomechanical, and reservoir response as a function of fundamental geological variables. The fundamental geological parameters (302: FIG. 3) are expected to be geometry or geometrical arrangement (e.g., sorting, ductile fraction), composition (e.g., compaction, diagenesis), mineralogy (e.g., clay, TOC, quartz, carbonate), geologic facies (e.g., gran size, shape, organization, net-to-gross), porosity and saturation, and initial geomechanical state (e.g., stress and fractures). The mineralogy and geometrical arrangement are expected to cluster as a function of geologic facies.

There are expected to four independent geophysical parameters (304: FIG. 3) to which remote sensing could have significant sensitivity: density, bulk modulus, shear modulus, horizontal transverse isotropic (HTI) anisotropy, vertical transverse isotropic (VTI) anisotropy, orthorhombic anisotropy, or a combination thereof. There could be additional parameters, such as density where geological (facies dependent) correlations to other geophysical parameters in 3D would be needed and is measured.

The geomechanical parameters (306: FIG. 3) are dependent on the details of microscopic dynamics. They can include parameters, such as: linear and nonlinear stress-strain parameters, material failure parameters, joint friction parameters, crack tip propagation parameters, crack fluid properties, initial stress and fractures, brittleness, failure stress, and failure strain. There are independent dynamical variable associated with the geomechanics such as: stress, strain, and the distribution of defects such as fractures, dislocations and voids. The multi-scale imaging and experimental analysis approach enables enhanced characterization of the porosity, pore and throat size distribution, pore connectivity, permeability and geomechanical responses of mudstones.

In addition to the task of determining multi-scale structure of shales, another task of the petrophysical stage 230 of FIGS. 2A-2B develops an effective geomechanical model for the shales. In this task, the results of multi-scale structure experiments are analyzed numerically to characterize the multi-scale behavior of the shales. The goal is to understand at what representative scale the rock can be described by an effective model based on statistical mechanical averages. It is expected to be a scale of between 100 microns to 1 mm. The numerical analysis can be similar to that used to understand the behavior of granites with significant predictive success.

In the numerical analysis, for instance, the dataset supplied from the experimental analysis is used, and the microscopic material properties of the shale are "upscaled." Such multi-scale systems analysis offers two mutually complimentary model characterizations, one from a microscopic viewpoint and the other from a macroscopic viewpoint. These are described below as "upscaling" and "continuum modeling," respectively. Both approaches used together close the loop for data constrained modeling at all scales, allowing a seamless integration of small-scale material complexity inside a large scale continuum model formulated on the basis of fundamental principles.

The upscaling approach starts with a microscopic view, describing the discrete microstructure from x-ray CT-scans obtained from the experimental analysis detailed above. The goal is to calculate bulk average material properties of interest. Upscaling can also be known as homogenization or data compression since the averaging process allows a direct calculation of material properties. This can be used to inform a continuum model in the computer simulation of fracturing and microseismic emission (detailed below).

The continuum model approach starts with a macroscopic view, informed either by an upscaling approach or alternatively by a thermodynamic model incorporating the basic physics. Continuum modeling can derive large scale boundary conditions for the microscopic model and can provide a method for data acquisition. This data acquisition occurs through two different modeling techniques. Large-scale information can be additionally considered through forward modeling, and intrinsic material properties can be derived through inverse modeling which would then close the loop to the holistic microseismic data analysis with uncertainty (detailed below).

b. Upscaling

The upscaling in the numerical analysis comprises four steps. The first step involves: (a) segmentation of the digital images and identification of mineralogy, defects and microstructure of target phases (obtained from the experimental analysis above). The second step involves: (b) Stochastic analyses of microstructure. This stochastic modeling is often skipped by commercial suppliers of Computed Tomography. However, this step is useful for deriving statistically meaningful upscaling of material properties. Percolation theory can be used as an instrument for upscaling, and the so-called local porosity theory can be used for derivation of a stochastic model. Although percolation theory and local porosity theory were first developed for the analysis of fluid flow networks, it is fully applicable to a more general microstructure framework. Percolation theory underpins a variety of other material properties (e.g. percolation in thermal, electrical conductivity, elasticity). Statistical results are obtained from a series of calculations on target clusters with the aim of identifying their statistical distribution functions. Anisotropy of properties are calculated by means of the star-volume distribution approach giving two empirical probability density functions, the isotropy index and the elongation index.

The third step in upscaling involves: (c) Representative Volume Elements and Percolation Theory. Representative volume elements (RVE's) are statistically representative volumes containing a sufficiently large set of microstructure elements such that their influence on the average macroscopic property (porosity, elasticity, permeability, etc.) has converged. Convergence of material properties does not imply that these properties can be safely scaled up. For this, additional parameters need to be calculated from the CT scan, notably, percolation threshold, correlation length, fractal dimension and critical exponent of correlation length from microtomography.

Finally, the fourth step in upscaling involves (d) Upscaling Digital Materials. The basic new elementary building blocks for upscaling digital materials used are described in steps (b) and (c) above. Prerequisites for the identification of a digital material for upscaling are: (1) empirical probability density function, isotropy index and elongation index are identified, (2) the percolation threshold for the target phase of interest has been reached, and (3) the size of the sample is significantly larger than the size of the correlation length for the target phase. Only when all three conditions have been fulfilled is it useful to derive material properties from digital or laboratory experiments for upscaling physical properties. If the material fulfills all necessary criteria for upscaling, then the digital material from the Computed Tomography (CT) image can be directly used for upscaling calculations.

c. Continuum Modeling

Having an understanding of upscaling, the details for continuum modeling in the numerical analysis are now described. Thermodynamically self-consistent continuum modeling formulated offers a robust way for material modeling. The consideration of thermodynamics is a relatively new development in computational mechanics. Thermodynamics has the advantage that it offers a direct access to a multi-scale framework since it defines a thermodynamic length and time scale for a specific problem of interest. From a macroscopic point of view, it is often possible to identify diffusion transport processes that can be described empirically by a diffusion equation (e.g. Fourier, Darcy, Fick, Ohm, etc.). The diffusion process defines a diffusional length scale for the multi-scale process system. The associated thermodynamic time scale based on the macroscopic concept of finite time thermodynamics, which considers the time scale of availability of a reservoir. For the above list of diffusion processes, the associated time scale is therefore given by the availability of heat, fluid, chemical species, electrons etc.

Material models based on the upscaling workflow using a thermodynamically consistent approach are then handed on to computer simulation of fracturing and microseismic emission (detailed below).

As noted above, a geomechanical model of the shale is determined from the empirical information. See Block 104 in FIG. 1. In developing the predictive model, the geomechanics of the shales are considered. The mechanisms dominant in fracture propagation within brittle materials is generally known, and hydraulically mediated fracturing is also more specifically known. However, there remain significant gaps in how this understanding applies to shales in situ. The role of spatially varying stress, anisotropic material properties, and the interaction between fracture fluid, pore fluid, gas phase, and mechanics remains an epistemic uncertainty in characterizing the expected response.

A number of tools exist that attempt to address this problem at different scales and fidelity, including low-fidelity commercial tools with little or no coupling to the stress field (e.g., Schlumberger's fast-running tools and Golder Associates' FracMan) to detailed, fully-coupled, computationally intense models. A number of applications span the middle range of fidelity and computational intensity.

In the past two decades, increasing attention has been paid to the use of so-called "bonded particle" as well as polygon/polyhedral DEM models, consisting of DEM (equivalently spring-mass-dashpot) systems with tensile and shear failure criteria for modeling fracture. Though often DEM models are micro-structurally defined, the use of bonded particle methods cannot be categorized as such, since the properties of the bonds between particles must be calibrated to match larger scale laboratory data. Here, these are classified in this study as null-order, micro-scale constitutive models. Numerous other constitutive models, however, exist to characterize the damage accumulation from a continuum scale, including thermodynamic consistency and anisotropy.

Because of computational expense, a constitutive model including anisotropic plasticity and damage is preferably used in the disclosed model in lieu of a detailed micro-scale treatment of fracture. This facilitates the computer simulation of fracturing and microseismic events detailed below. This model is calibrated, however, using a high-fidelity simulation battery, using the constitutive model and associated parameters from the geomechanics of shales in a combined finite-discrete element code with direct fluid coupling for single-phase flow through a fracture network as well as an arbitrary crack path fracture mechanics capability to appropriately capture the hydromechanical response during stimulation.

More recently, the resultant seismicity from fracture has been characterized from bonded DEM models. These, however, are computationally intensive, and other constitutive models originating in the fracture mechanics and seismology fields appear to offer significant advantages in terms of computational expediency coupled with decades of validation. These rate- and state-based friction laws continue to gain support from field and laboratory studies. Enhancement of the applicability of these relations is enhanced through the inclusion of von Karman random fields. Because of the maturity and computational favorability, the disclosed predictive model preferably uses rate- and state-based friction laws as the basis for the source modeling in the medium fidelity simulation discussed in the computer simulation of fracturing and microseismic events detailed below.

By assembling together multi-scale, dual porosity hydromechanical simulation capabilities, a set of appropriate constitutive models to capture the sub-RVE scale behavior of the reservoir for seismic source generation and coupled hydromechanical response, and capabilities (discussed next) to propagate seismic signals to measurement stations, the predictive model provides an in silico platform to assess and predict reservoir response. This may be analogous to a dual porosity hydromechanical reservoir model augmented with robust adaptive multi-scale, explicit treatment of the hydraulic fracturing event, and facilities to propagate seismic rupture events to ground response.

As noted above, after characterizing information of the various geological, geomechanical, and geophysical parameters of the shales, empirical relationships (e.g., trends) in the shale are developed. See Block 106 in FIG. 1A. After understanding the geomechanics of the shales (through experimental study of multi-scale structures and developing geomechanical structures for shales), for example, the disclosed model involves developing a computer simulation of fracturing and microseismic emission.

For a high fidelity simulation, a high fidelity model is develop and validated using both current material models and the results of the analysis above. This model simulates the behavior of the bulk material, the development of fractures, and the associated seismic wave generation. This task develops an anisotropic, thermodynamically consistent constitutive model to capture plasticity associated with damage (similar to the model of Lomov) formulated for use in an implicitly integrated Lagrangian finite element code. The constitutive model also includes a tensoral stress-permeability relationship based on sub-scale geostatistically characterized joints and faults. Coupled with the constitutive model developed at ANU, this provides a comprehensive description of the behavior of shales through the range of behaviors expected during and after stimulation. The geostatistics and effective continuum hydrological behavior of the sub-scale as well as the stress-permeability relationships for fractured media are derived from previous studies.

The constitutive model is coupled with a subscale representation of the geostatistically distributed joints and faults which are assessed for failure based on a strain criterion informed through the strain field calculated in the representative volume element (RVE). For each of the sub-scale discontinuities in the RVE that proceed into a rupture state, the seismic source term is based on a well-validated rate- and state-based friction law, which provides the necessary moment tensor and time of rupture used to validate the code against the Gutenberg-Richter relationship assessed through the seismic data analysis.

For low fidelity simulation, a low fidelity (fast) model is developed and validated by study of fundamental (single) fracture nucleation, growth, and seismic wave generation. The model abstracts the material as a coupled network of such fundamental units. Using results from running a medium fidelity model developed from the high fidelity model as well as available experimental data, parameters and functional relationships used in the low fidelity model can be tuned for specific geologies and sites to agree with the high fidelity results.

2. Multi-Component Seismic Imaging, Model-Based Inversion, and Geomechanical Simulation As noted above, seismic data is obtained in the area of interest using various techniques for seismic imaging. See Block 108 in FIG. 1A and stages 240 in FIGS. 2A-2B. Then, a predictive model of the fracturing in the shale is produced by an inversion process of the seismic data and the trends. See stage 250 in FIGS. 2A-2B.

As shown in particular in FIG. 2B, the workflow 200 involves obtaining seismic data through seismic surveys 242, and the data is used in multi-component seismic imaging 240 to produce imaging data, such as near, far, P-wave, and S-wave stacks. The seismic data can be obtained using any of a variety of surface seismic systems (10: FIG. 1B) having geophones, sources, and the like. Wavelet information from local wells 252 in the area of interest can also be combined with the imaging data 245.

The seismic imaging 240 and wavelet information for the wells 252 is combined with petrophysical trends 300 in a model-based inversion stage 250 to produce a predictive model 255 according to the present disclosure. As used herein, inversion refers to the process of assimilating the data with the model by taking the data and averaged model and using known physics to reduce the uncertainty involved in the model.

The object of the model 255 is to have the seismic data be consistent with the observed simulation. The inversion stage 250 therefore links the seismic data with the geomechanical inversion (262: FIG. 2B), in which the model 255 is assessed according to the geomechanical parameters of the shale. Then, the geomechanical inversion stage 262 can predict characteristics, features, and other details of fractures in the shale, indicating the fractures that can be produced and the effects on reservoir performance.

3. Microseismic Analysis

As noted previously, the geomechanical inversion stage 262 can be enhanced by obtaining microseismic data of the area of interest. For example in FIG. 2B, the geomechanical inversion stage 262 is further enhanced by the microseismic analysis stage 270, which involves a number of details provided below.

In general, the microseismic analysis stage 270 provides a holistic method of analyzing microseismic data based on the geomechanical manipulation of shales with uncertainty. Here, holistic means a Bayesian statistical method of integrating a set of vertical buried arrays (22: FIG. 1) (one per square kilometer, and one per 20 meters to a depth of 100 meters vertically, three component high sensitivity cemented geophones, both compressional and shear modes) for the location, moment magnitude tensors, velocity field, and attenuation. A particular technique for obtaining and processing microseismic events is disclosed in co-pending U.S. application Ser. Nos. 13/759,956 and 13/759,990, filed 5 Feb. 2013 and entitled "Integrated Passive and Active Seismic Surveying Using Multiple Arrays," which are both incorporated herein by reference in their entireties.

Velocity information with uncertainty from surface seismic imaging is used as an initial model. The buried array data is analyzed for the microseismic events associated with the fracturing, but use is also made of known "calibration" events such as perforation events, string shots and surface seismic sources, along with naturally occurring seismic events. Methods such as Matched Field Processing and interferometry may be of significant utility. The deliverable is the statistical Bayesian data assimilation computer program.

The analysis stage 270 can adapt existing algorithms to be applied to the geometries and anisotropies experienced in microseismic monitoring of hydraulic shale fracturing. This includes both the Bayesian location algorithm, Bayesloc, and the empirical matched field (EMF) detection algorithm. As the EMF technique is feasible with any master event, it may be tuned to identify anomalous signals such as the low frequency long duration events observed in some hydraulic stimulations.

The results form the basis for a more holistic Bayesian analysis, which include the estimation of the velocity, attenuation, and the moment magnitude tensor as parameters in the Bayesian analysis. It is expected that interferometry be included to give sensitivity to the velocity between buried arrays and wells.

a. Microseismic Event Location

To validate the geomechanical inversion stage 262 with the microseismic analysis stage 270, it is desirable to improve the detected location of microseismic events as well as increase the sensitivity of detection. Microseismic locations are subject to error due to inherent uncertainties in the sub-surface seismic velocities and phase measurements; however, most location algorithms assume Gaussian statistics for a strongly non-Gaussian process, which results in poor error estimates. Bayesloc is a new algorithm in open source software developed at Lawrence Livermore National Laboratory that avoids this limitation by using a combined Bayesian and Markov Chain Monte Carlo (MCMC) sampler to create a probabilistic estimate of the source coordinates of the microseismic events. This provides significant robustness in the presence of errors in the earth model and microseismic data and can simultaneously locate microseismic events, correct for errors in microseismic travel time predictions, assess the precision of arrival-time measurements, and determine the microseismic phase label for each arrival. Although prior information is not required, such information can be used to reduce solution uncertainty. Although Bayesloc has primarily been used for regional and global data sets (>100 km events), it has also been successfully used to improve tomography. Finally, Bayesloc can be applied to geothermal micro-seismic datasets.

b. Model Comparison

Figure 5:
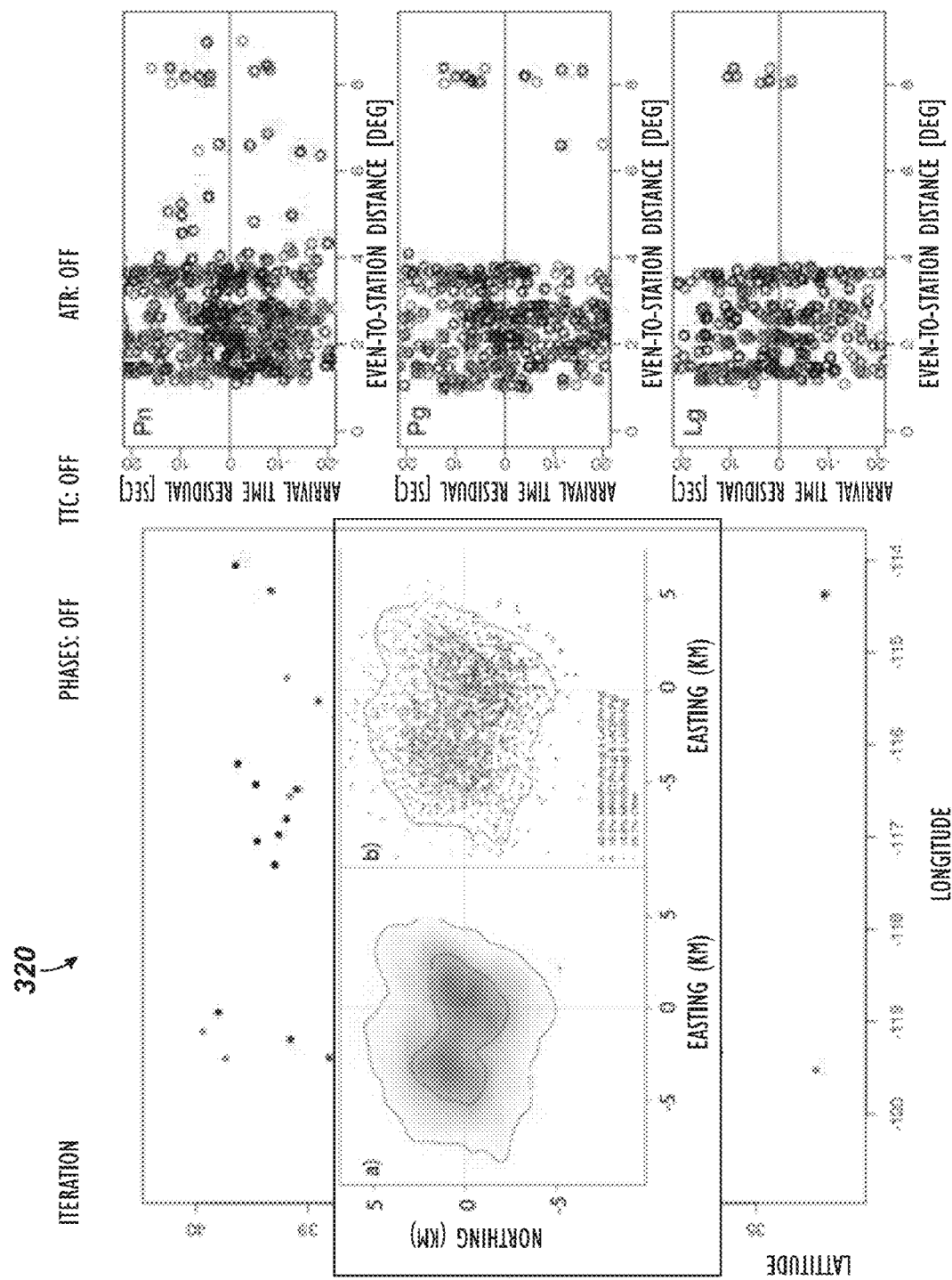
FIG. 5 shows graphical representations of Bayesian seismic event location.

In the microseismic analysis stage 270, the microseismic imaging process requires three steps: detection, location, and source analysis (in some implementations detection and location are combined). To detail with these steps, Bayesloc provides both absolute and relative locations along with Bayesian (rather than Gaussian) error statistics. These techniques can be used to develop comprehensive datasets for comparison with geomechanics code output. The results of the model and data comparison, when buttressed by reliable Bayesian statistics, guide the next step of model and algorithm improvement. The eventual incorporation into an overall Bayesian framework requires common characterization of model results and observed data and may use a metric of texture to compare model results to the observed data. FIG. 5 shows graphical representations of Bayesian seismic event location.

E. Extended Workflow

Figure 6:
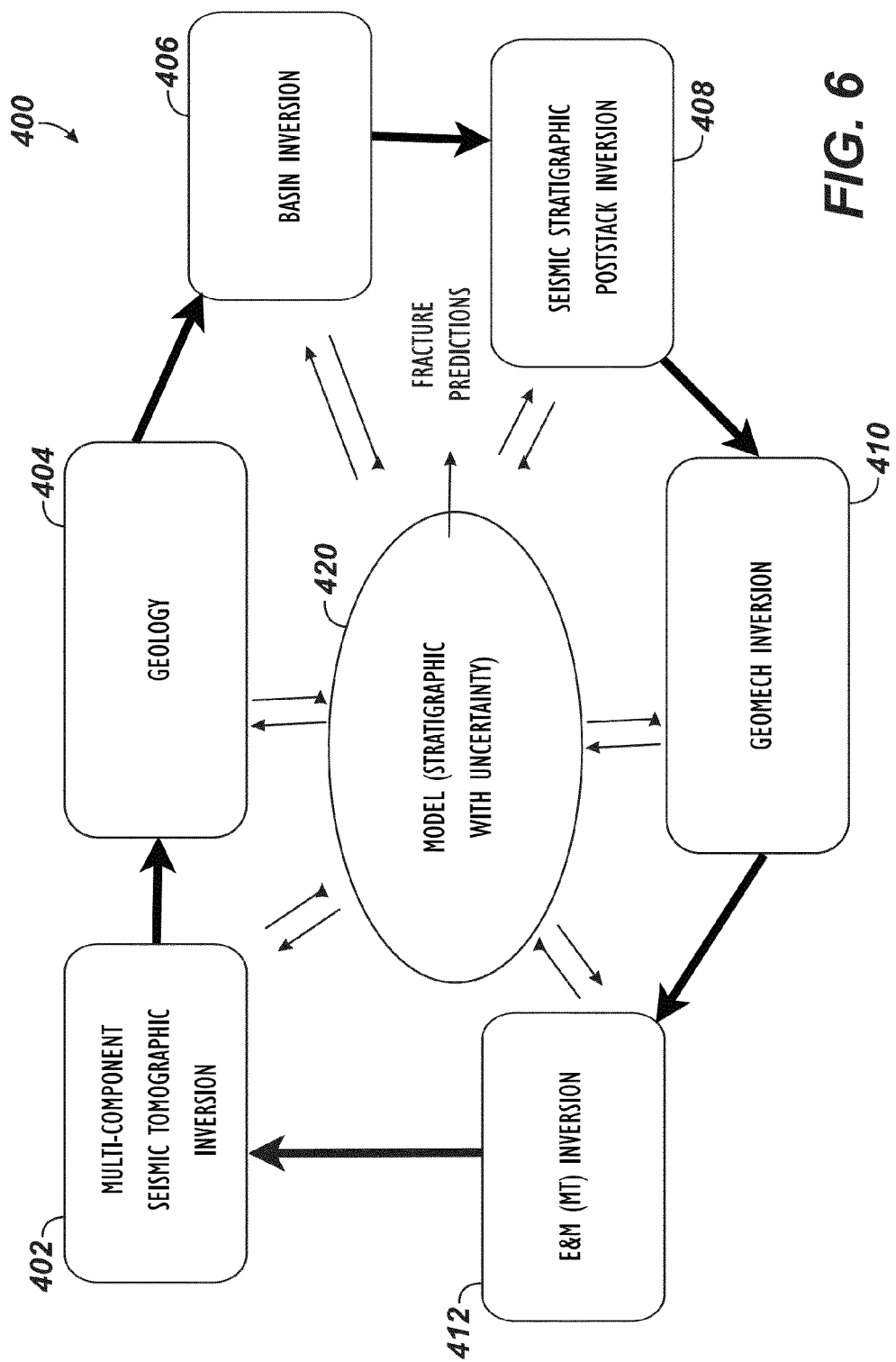
FIG. 6 shows an extended workflow of the disclosed model to predict fracturing in shale.

Finally as noted previously, the model for predicting fracturing in the shale is refined using additional information from other inversion stages and from interpretation of seismic data. FIG. 6 shows an extended workflow 400 for refining the disclosed model 420 for predicting fracturing in shale. Similar to FIG. 2B in which the workflow 200 include looped stages, a number of stages in this workflow 400 of FIG. 6 interconnect and provide input to one another to build the predictive model 420. The stages include multi-component seismic tomographic inversion 402, geology 404, basin inversion 406, seismic stratigraphic post-stack inversion 408, geomechanical inversion 410, and Electromagnetic (EM) or Magneto Telluric (MT) inversion 412. Data for each of these stages can refine and improve the model 420, reducing its uncertainty, and the predictive model 420 may be developed using one or more of these stages.

Figure 7:
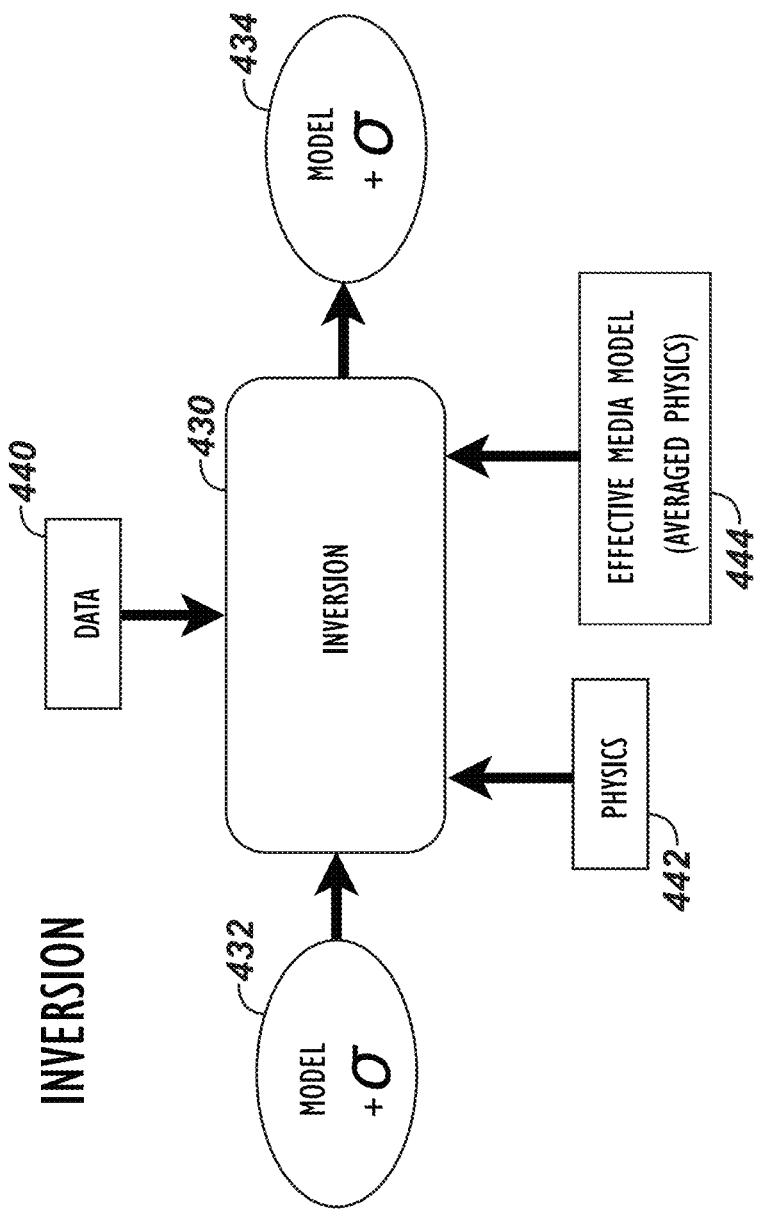
FIG. 7 diagrams an inversion process utilized in the disclosed model.

As noted herein, an inversion assimilates data using a physical forward model with effective medias (uncertainties are required). FIG. 7 diagrams an inversion process 430 utilized in the disclosed model. In the inversion process 430, a model 432 is input into the inversion process 430 along with data 440, physics 442 (i.e., direct physical model or constraints involved), and an effective media model (i.e., averaged physics or statistical average of physical models or constraints involved). The inversion process 430 then performs the assimilation using known procedures in inversion technology and statistical physics so that a resulting model 434 is constrained by having it fit the data 440.

The predictive model disclosed herein can be used to understand the geological, geophysical, and geomechanical properties of shales and can be embedded in geomechanical computer simulations to predict reservoir performance from fracturing and associated microseismic events generated by fracturing. In other words, the predictive model can operate using a fast-running, hydromechanical forward simulation with user-based scenarios (i.e., what-if scenarios) to produce various simulation outcomes. Seismic monitoring can analyze the data stream to assess the error between the above-predictions and the model, and seismic interpretation can ultimately refine the geomechanical model and boundary conditions so the model is more accurate in it predictions.

As will be appreciated, teachings of the present disclosure can be implemented in digital electronic circuitry, computer hardware, computer firmware, computer software, or any combination thereof. Teachings of the present disclosure can be implemented in a computer program product tangibly embodied in a machine-readable storage device for execution by a programmable processor so that the programmable processor executing program instructions can perform functions of the present disclosure. The teachings of the present disclosure can be implemented advantageously in one or more computer programs that are executable on a programmable system including at least one programmable processor coupled to receive data and instructions from, and to transmit data and instructions to, a data storage system, at least one input device, and at least one output device. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks.

Any of the foregoing can be supplemented by, or incorporated in, ASICs (application-specific integrated circuits).

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A method of predicting fractures in shale in an area of interest, the method comprising:
    establishing one or more relationships between a geological parameter of shale with one or more of a geomechanical parameter and a geophysical parameter of the shale;
    obtaining observed data of the area of interest; and
    producing a computerized model for modeling fracturing of shale in the area of interest by constraining a forward physics model of the area of interest with the one or more relationships for consistency with the observed data.

2. The method of claim 1, wherein the geological parameters comprises one or more of geometry, sorting, ductile fraction, composition, compaction, diagenesis, mineralogy, geologic facies, grain size, shape, organization, net-to-gross, porosity, saturation, stress, fractures, pore size, throat size, pore distribution, throat distribution, pore connectivity, or a combination thereof.

3. The method of claim 1, wherein the geomechanical parameters comprises one or more of stress-strain parameter, material failure parameter, joint friction parameter, crack tip propagation parameter, crack fluid properties, initial stress, initial fracture, or a combination thereof.

4. The method of claim 1, wherein the geophysical parameter comprises one or more density, bulk modulus, shear modulus, horizontal transverse isotropic (HTI) anisotropy, vertical transverse isotropic (VTI) anisotropy, orthorhombic anisotropy, or a combination thereof.

5. The method of claim 1, wherein the forward physics model is selected from the group consisting of a full seismic wave propagation model; a geomechanical forward model; a spike convolution model; a raytrace seismic model; a hyperbolic moveout model for flat earth layers; an electromagnetic propagation model; a model for basin evolution including pressure diffusion, sedimentation, or compaction; and a model of a geologic process of sedimentation including wave induced flow, turbidite flow, or fluvial deposition.

6. The method of claim 1, wherein establishing the one or more relationships between the geological parameter of the shale with one or more of the geomechanical parameter and the geophysical parameter of the shale comprises:
    obtaining first information characterizing the geological parameter of the shale;
    obtaining second information characterizing the geomechanical parameter or the geophysical parameter of the same shale; and
    developing an empirical relationship between the obtained first and second information.

7. The method of claim 6, wherein the geological, geomechanical, and geophysical parameters are characterized at multiple scales.

8. The method of claim 7, wherein the multiple scales are selected from the group consisting of nano-pore scale, micron scale, millimeter scale, plug scale, and seismic scale.

9. The method of claim 6, wherein obtaining the first or second information comprises analyzing properties of the shale from one or more of core samples, well logs, and scans of the core samples.

10. The method of claim 6, wherein developing the empirical relationship comprises relating a given one of the parameters at one scale to another scale.

11. The method of claim 6, wherein developing the empirical relationship between the obtained first and second information comprises modeling geomechanics of rock fracturing in the shale by relating the geological parameters of the shale with the geophysical and geomechanical parameters of the shale.

12. The method of claim 1, wherein the observed data comprises compressional surface seismic data; converted wave seismic data; microseismic data; well log data; geologic deposition data; electromagnetic data; production data including pressure data, produced volumes, or injected fluid volume; or a combination thereof.

13. The method of claim 12, wherein the observed data comprises error, and wherein the method further comprises accounting for the error in the observed data.

14. The method claim 6, wherein obtaining the second information characterizing the geomechanical parameter or the geophysical parameter of the same shale comprises determining the one or more of the geomechanical parameter and the geophysical parameter from the characterized geological parameter.

15. The method of claim 14, wherein determining the one or more of the geomechanical parameter and the geophysical parameter from the characterized geological parameter comprises upscaling microscopic geological properties of the shale.

16. The method of claim 15, wherein determining the one or more of the geomechanical parameter and the geophysical parameter from the characterized geological parameter comprises deriving large scale boundary conditions of the shale by performing continuum modeling based on a thermodynamic model.

17. The method of claim 1, wherein constraining the forward physics model based on the one or more relationships for consistency with the observed data comprises using a data assimilation method of the observed data with the one or more relationships.

18. The method of claim 17, wherein the data assimilation method comprises inversion, Bayesian inversion, linear inversion, an inversion finding a minimum of an objective function, an inversion of an estimated response surface to the forward physics model, a heuristic optimization, or a combination thereof.

19. The method of claim 1, wherein obtaining the observed data in the area of interest comprises obtaining microseismic data in the area of interest using a microseismic survey system.

20. The method of claim 19, wherein obtaining the microseismic data further comprises inducing fracture in the shale by performing a fracture operation in a well of the area of interest.

21. The method of claim 1, further comprising refining the produced model by assimilating at least one of multi-component seismic tomographic information, geologic deposition information, basin evolution information, geomechanical information, electromagnetic information, and Magneto Telluric (MT) information.

22. A programmable storage device having program instructions stored thereon for causing a programmable control device to perform a method of claim 1.

* * * * *